US008023832B2

(12) United States Patent
Mizuno et al.

(10) Patent No.: US 8,023,832 B2
(45) Date of Patent: Sep. 20, 2011

(54) LIGHT RECEIVING CIRCUIT AND DIGITAL SYSTEM

(75) Inventors: Masayuki Mizuno, Tokyo (JP); Keishi Ohashi, Tokyo (JP); Koichi Nose, Tokyo (JP); Kenichi Nishi, Tokyo (JP)

(73) Assignee: NEC Corporation, Tokyo (JP)

( * ) Notice: Subject to any disclaimer, the term of this patent is extended or adjusted under 35 U.S.C. 154(b) by 733 days.

(21) Appl. No.: 12/067,625

(22) PCT Filed: Sep. 26, 2006

(86) PCT No.: PCT/JP2006/319006
§ 371 (c)(1),
(2), (4) Date: Mar. 20, 2008

(87) PCT Pub. No.: WO2007/037212
PCT Pub. Date: Apr. 5, 2007

(65) Prior Publication Data
US 2009/0269084 A1    Oct. 29, 2009

(30) Foreign Application Priority Data
Sep. 28, 2005 (JP) ................................. 2005-282118
Jan. 25, 2006 (JP) ................................. 2006-016385

(51) Int. Cl.
*H04B 10/06* (2006.01)
(52) U.S. Cl. ........ 398/202; 398/214; 398/208; 398/210; 398/171
(58) Field of Classification Search .......... 398/202–214, 398/171, 140
See application file for complete search history.

(56) References Cited

U.S. PATENT DOCUMENTS

| 4,051,363 | A | * | 9/1977 | Fish | 398/214 |
| 5,488,415 | A | * | 1/1996 | Uno | 348/241 |
| 6,219,166 | B1 | * | 4/2001 | Shang et al. | 398/202 |
| 7,269,359 | B1 | * | 9/2007 | McAdoo | 398/205 |
| 7,425,720 | B2 | * | 9/2008 | Kaeriyama et al. | 257/4 |
| 7,485,838 | B2 | * | 2/2009 | Nishi et al. | 250/214 A |
| 7,518,626 | B2 | * | 4/2009 | Matsuda | 347/236 |
| 2003/0210916 | A1 | * | 11/2003 | Jennen et al. | 398/202 |
| 2006/0067703 | A1 | * | 3/2006 | Haunstein et al. | 398/161 |

(Continued)

FOREIGN PATENT DOCUMENTS
JP          59-135938          8/1984
(Continued)

OTHER PUBLICATIONS

Receiver-Less Optical Clock Injection for Clock Distribution Networks, IEEE Journal of Selected Topics in Quantum Electronic, vol. 9, No. 2, Mar./Apr. 2003, Debaes et al., pp. 1-10.

*Primary Examiner* — Ken Vanderpuye
*Assistant Examiner* — Hibret Woldekidan
(74) *Attorney, Agent, or Firm* — Sughrue Mion, PLLC

(57) ABSTRACT

A light receiving circuit (114) includes a light inputting circuit (113) which converts one-system optical signal to be outputted from an optical transmission path (101) to an electrical signal and inverts a potential of the electrical signal each time the optical signal is detected, and a buffer circuit (110) which amplifies the electrical signal converted by the light inputting circuit and outputs the same. According to such configuration, since one-system optical signal may be inputted to the light receiving circuit, a system circuit configuration can be avoided to be complicated.

22 Claims, 16 Drawing Sheets

U.S. PATENT DOCUMENTS

2009/0310978 A1* 12/2009 Uemura et al. ............... 398/195

FOREIGN PATENT DOCUMENTS

| | | |
|---|---|---|
| JP | 64-041329 | 2/1989 |
| JP | 07-038419 | 2/1995 |
| JP | 08-023310 | 1/1996 |
| JP | 2000-156614 | 6/2000 |
| JP | 2002-153055 | 5/2002 |
| JP | 2003-287656 | 10/2003 |
| JP | 2004-288675 | 10/2004 |
| JP | 2005-223950 | 8/2005 |
| JP | 2006-066511 | 3/2006 |
| WO | 98-03224 A1 | 1/1998 |
| WO | 2005-098966 A1 | 10/2005 |

* cited by examiner

LIGHT RECEIVING CIRCUIT AND DIGITAL SYSTEM

TECHNICAL FIELD

The present invention relates to light receiving circuits which convert an optical signal to an electrical signal and, more particularly, relates to a light receiving circuit for use in a digital system which is for realizing high speed optical communication.

BACKGROUND ART

In a digital system, speeding up or wider bandwidth of signal transmission is the most fundamental problem. In a conventional art which uses electrical interconnection in signal transmission, it is difficult to actualize high speed operation in the range of not lower than gigahertz. On the other hand, in signal transmission by means of light, light is used by modulating in a frequency considerably lower than the frequency (to several hundred terahertz), so that it is hard to raise a problem associated with the speeding up.

In high speed signal transmission by means of electrical interconnection, capacitance due to interconnection needs to be charged; whereas, in signal transmission by means of optical interconnection, capacitance due to interconnection does not need to be considered. Consequently, if capacitance of an optical receiver is sufficiently small, electric power consumption of the entire circuit can be suppressed.

Nowadays, reduction in circuit voltage is required; however, in order to cope with such request, it is necessary to suppress generation of electromagnetic noise and enhance resistance against noise. Consequently, optical interconnection is strongly required to be introduced in a digital system, particularly in a semiconductor integrated circuit. In the semiconductor integrated circuit, particularly, distribution means for clock signals and large capacity data transfer means in buses for use in communication between subsystems are required.

A clock signal is an important signal which decides timing and throughput of the entire system in a synchronous type digital system. For example, clock frequency of a central processing unit (referred to as CPU) is a basic factor which decides data processing speed. Bus clock frequency is a basic factor which decides data transfer speed.

In order to actualize high speed data transfer speed, it is required to use high speed memory elements such as a latch and a flip-flop, and to prevent a racing condition in which a clock signal faultily passes through not lower than two memory elements for one period. Furthermore, when distributing the clock signals, an invalid time in machine cycle needs to be as small as possible in order to minimize an increase in cycle time.

In a high speed digital system, it is an important problem to distribute the clock signals so as to suppress skew in which a phase difference is generated in waveforms between locations. In order to reduce the skew, there is used an H-tree system or the like which performs electrical interconnection so that all circuits are arranged in equal distance from a clock driver. Examples of the skew factor other than the interconnection include that transistors to be used and interconnection parameters vary according to processes, or clock buffer delays are different through the entire system because load capacities are not uniform.

In buses for connecting between subsystems, there include buses for connecting between processor memories which require high speed performance, input and output buses in which devices to be connected are over broadband, and the like. Speeding up has been observed in not only processors and memories, but also in input and output devices; and therefore, demand for higher speed and wider bandwidth with respect to the buses is further increased. However, there is a limit for higher speed and wider bandwidth by means of electrical interconnection.

On the other hand, in the signal transmission by means of light, wider bandwidth can be used as compared with the signal transmission by means of electrical interconnection; and moreover, there is an advantage in that electromagnetic noise is not generated. This suggests that high speed clock distribution by means of light can be made.

By the way, a signal voltage which is obtained from an optical receiver in the case where a light source having a usual output level for use in electronics such as a laser diode is too low for operating a digital circuit in a large scale integrated circuit (referred to as LSI). Consequently, in order to operate the digital circuit by electrical signals from the optical receiver, a trans-impedance amplifier (referred to as TIA) is generally provided at a later stage of the optical receiver.

On the condition that input impedance is high and output capacity of the optical receiver is small, the TIA can output a high signal voltage necessary for the clock distribution by means of light. In this regard, however, in order to actualize, an installation size of the TIA needs to be approximately several 10 to 100 µm, which is larger than the optical receiver. Therefore, it is not easy to provide many light receiving elements with the TIA on the LSI.

Furthermore, in order to ensure a sufficiently high signal/noise ratio in an optical transmission system, there is a technique which uses an optical signal having a very short pulse width. According to such technique, a high signal voltage can be taken out from a light receiving element with small electric power consumption. Generally, a mode-lock laser or the like in which a peak output reaches in the range of kilowatt is used for such purpose. The mode-lock laser can generate an optical pulse train which has a pulse interval with very small fluctuation; and therefore, the mode-lock laser can be used for clock distribution by means of light, which is disclosed in Non-Patent Document 1 (to be described later).

A pulse signal from the light receiving element can be converted to High and Low binary signal groups by an integrating circuit or a high speed memory element such as a latch, a flip-flop, or the like. As such an optical interconnection circuit, Patent Document 1 discloses a configuration which separately irradiates two optical pulse train signals to two metal-semiconductor-metal (referred to as MSM) photodiodes.

In addition, Non-Patent Document 1 discloses that a clock signal of 10 GHz can be created without using the TIA having a large installation area by irradiating two optical pulse trains which differ in phase by a half period to two photodiodes connected in a totem pole type using the mode-lock laser.

Patent Document 1: Japanese Patent No. 2721475
Non-Patent Document 1: C. Debaes et al., Receiver-less optical clock injection for clock distribution networks, IEEE J. Selected Topics in Quantum Electronics, vol. 9, pp. 400-409, 2003

DISCLOSURE OF THE INVENTION

Problems to be Solved by the Invention

However, the optical interconnection circuit and optical clock circuit disclosed in Patent Document 1 and Non-Patent Document 1 need two system optical pulse trains which are the same in frequency and different in phase; and therefore, a circuit configuration which transmits an optical clock signal becomes complicated.

For example, as shown FIG. 10, Patent Document 1 proposes a complementary optical interconnection circuit which transmits two system optical pulse trains which are different in phase using two optical transmission paths and generates an electric pulse corresponding to an interval of the optical pulse. However, in optical clock signal transmission by such technique, two light sources and two optical transmission paths are required, respectively. In addition, such characteristics need to be uniform for each element.

Consequently, in the technique disclosed in Patent Document 1, structure components for transmitting optical clock signals are needed by the number two times as large as a place in which clocks are divided. Particularly, as for the optical transmission path, transmission paths which are substantially equal in distance from the light source need to be arranged in two pairs.

The present invention has been made in view of the above-mentioned problem and an object of the present invention is to provide a technique capable of simplifying a configuration of a circuit which inputs an optical signal to a light receiving circuit.

Means for Solving Problem

A light receiving circuit according to the present invention includes a light inputting circuit converting a one-system optical signal to be outputted from an optical transmission path to an electrical signal and inverting a potential of the electrical signal each time the optical signal is detected; and a buffer circuit amplifying the electrical signal converted by the light inputting circuit and outputs the electrical signal.

A digital system according to the present invention includes a plurality of the light receiving circuits, and an optical transmission path which inputs one-system optical signal to each of the plurality of the light receiving circuits.

EFFECTS OF THE INVENTION

According to the present invention, when an optical signal is converted to an electrical signal, since one system optical pulse may be inputted to a light receiving circuit from an optical transmission path, it is not necessary to input two system optical pulses having a phase difference to the light receiving circuit. Consequently, a circuit configuration which is for inputting the optical signal to the light receiving circuit can be avoided to be complicated.

DESCRIPTION OF REFERENCE NUMERALS

Figure 1:
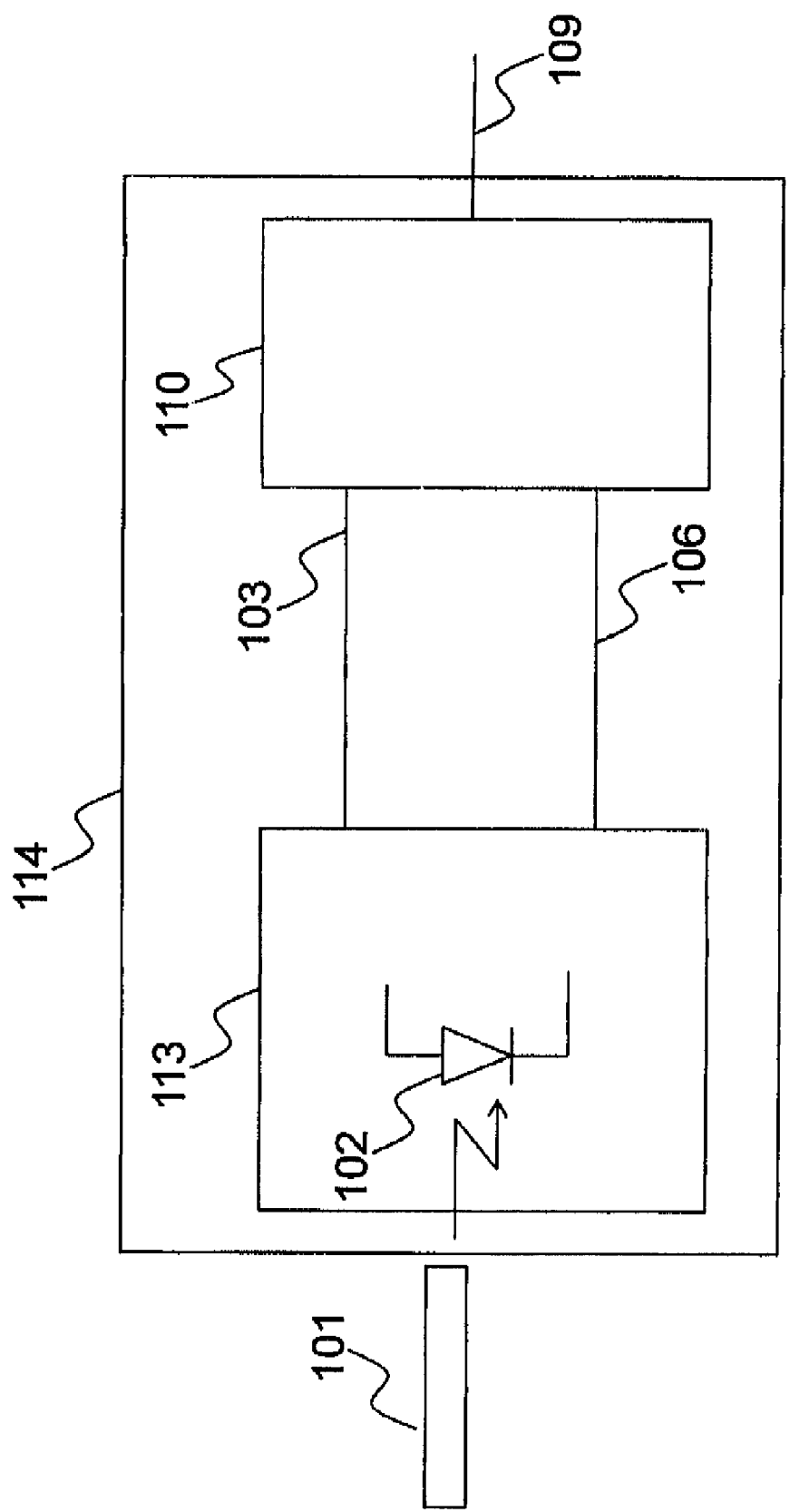
FIG. 1 is a circuit diagram of a first embodiment of the present invention.

100 Digital system
101 Optical transmission path
102 Light receiving element
102*a* First light receiving element
102*b* Second light receiving element
103 First signal line
104 First power supply line
105 Second power supply line
106 Second signal line
107 First switching circuit
108 Second switching circuit
107-1 and 107-2 nMOS transistor
108-1 and 108-2 pMOS transistor
109 Signal line
110 Buffer circuit
113 Light inputting circuit
111 Second switching circuit
112 First switching circuit
114 Light receiving circuit
115 Reset circuit
116 Reset signal line
102' Schottky photodiode
1: Substrate, 2: n+ type semiconductor layer, 3: n− type semiconductor layer, 4: Metal periodic structure, 5: First electrode, 6 and 12: Central concave portion, 7: Insulation layer, 8: Second electrode, 9: Bias power supply, 10: Resistive load, 11: Signal light, 12: Slit

BEST MODE FOR CARRYING OUT THE INVENTION

First Embodiment

FIG. 1 shows a first embodiment according to the present invention. Referring to FIG. 1, a light receiving circuit 114 of the present embodiment includes a light inputting circuit 113 including a light receiving element 102 which detects an optical signal from an optical transmission path 101 and a buffer circuit 110 connected to a light inputting circuit 113 via a first signal line 103 and a second signal line 106. The optical signal in which the light receiving circuit 114 receives from the optical transmission path 101 is one system optical pulse train.

The light inputting circuit 113 converts the optical signal from the optical transmission path 101 to an electrical signal and outputs the same by the second signal line 106, and inverts a potential of the second signal line 106 each time the optical signal is detected. The buffer circuit 110 amplifies the electrical signal from the light inputting circuit 113 and outputs the same to a signal line 109; and transmits the potential of the second signal line 106 to the first signal line 103.

Necessity of a configuration related to the first signal line 103 and the signal line 103 depends on a configuration on the light inputting circuit 113 side. That is, in the case where means which transmits the potential of the second signal line 106 to the light inputting circuit 113 side is configured in the light inputting circuit 113, it becomes possible to eliminate the need for the first signal line 103 of the present embodiment and associated configuration.

According to the present embodiment, when an optical signal is converted to an electrical signal, one system optical pulse may be inputted from the optical transmission path 101 to the light receiving circuit 114; and therefore, it becomes possible to eliminate the need to input two system optical pulses as in a conventional art. Consequently, a circuit configuration which is for inputting optical signals to the light receiving circuit 114 can be avoided to be complicated.

Furthermore, the light receiving circuit 114 does not make a potential level of an output signal correspond to strong and weak of the detected optical signal as in the conventional circuit, but, operates so as to invert the potential level of the output signal each time the optical signal is detected; and therefore, a light emitting interval of light to be inputted to the optical transmission path 101 may be very short time as compared with a conventional system. That is, the light emitting interval of light to be inputted to the optical transmission path 101 may be the same as a time from the light receiving element 102 receives light to the potential of the first power supply line 103 is inverted, or may be shorter than that time.

Consequently, it becomes possible to input light stronger than ever before to the optical transmission path 101; and in such a case, sensitivity of the light receiving element 102 for use in the light receiving circuit 114 may be relatively low. Furthermore, the light emitting interval can be shortened than ever before; and therefore, electric power consumption of a light source can be reduced. In this case, as for the light receiving element 102, its structure and principle are not particularly limited; but, a photodiode of a general Schottky type, a PIN-type, or the like may be used. That is, it can be used if a system can essentially convert an optical signal to an electrical signal.

Figure 2:
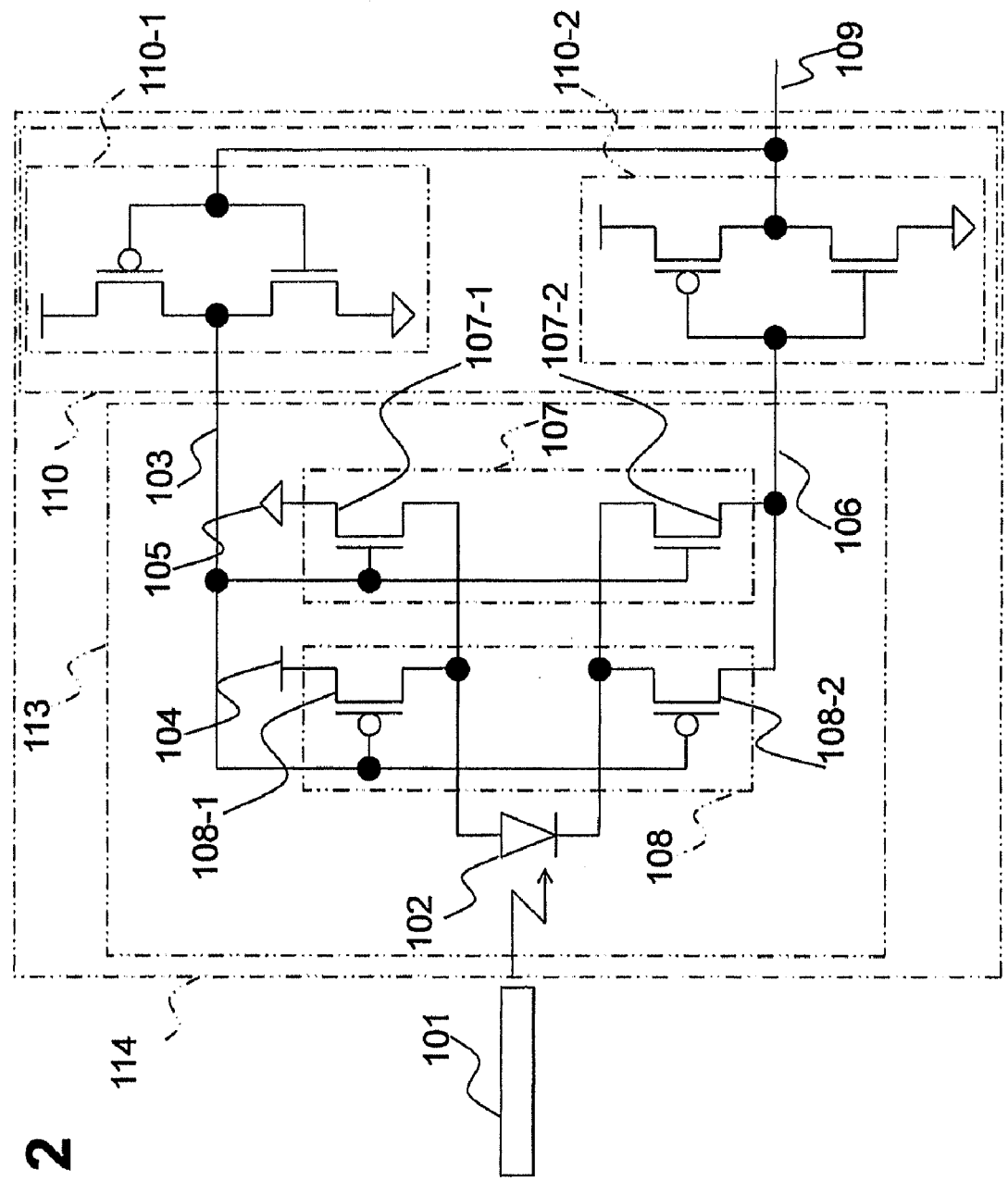
FIG. 2 is a circuit diagram of a first specific example according to the first embodiment.

Three specific examples regarding the above described first embodiment will be described below. FIG. 2 shows a configuration of a first specific example. Referring to FIG. 2, a light inputting circuit 113 in a light receiving circuit 114 of the present specific example is a configuration in which a first and a second switching circuits 107 and 108 are connected to a light receiving element 102. Furthermore, a buffer circuit 110 includes two CMOS inverter circuits 110-1 and 110-2.

The first switching circuit 107 has two nMOS transistors 107-1 and 107-2 whose gate electrodes are connected to a first signal line 103, respectively. The nMOS transistor 107-1 has a drain electrode connected to an anode side of the light receiving element 102, and a source electrode connected to a second power supply line 105 from the ground. Furthermore, another nMOS transistor 107-2 has a drain electrode connected to a second signal line 106, and a source electrode connected to a cathode side of the light receiving element 102.

The second switching circuit 108 has two pMOS transistors 108-1 and 108-2 whose gate electrodes are connected to the first signal line 103, respectively. The pMOS transistor 108-1 has a drain electrode connected to the anode side of the light receiving element 102, and a source electrode connected to the first power supply line 104 from a power supply. Furthermore, another pMOS transistor 108-2 has a drain electrode connected to the second signal line 106, and a source electrode connected to the cathode side of the light receiving element 102.

The CMOS inverter circuit 110-1 of the buffer circuit 110 has gate electrodes of respective MOS transistors which constitute the CMOS inverter circuit 110-1, the gate electrodes being connected to the signal line 109; and the CMOS inverter circuit 110-1 transmits an inverted potential with respect to a potential of the signal line 109 to the first signal line 103. Another CMOS inverter circuit 110-2 has gate electrodes of respective MOS transistors which constitute the CMOS inverter circuit 110-2, the gate electrodes being connected to the second signal line 106; and the CMOS inverter circuit 110-2 transmits an inverted potential with respect to a potential of the second signal line 106 to the signal line 109.

In the thus configured light receiving circuit 114, when the light receiving element 102 becomes in an ON state by detecting an optical signal, the second signal line 106 is short-circuited to the second power supply line 105 in the case where a potential of the first signal line 103 is equal to that of the first power supply line 104. With this configuration, the potential of the second signal line 106 becomes a Low level; further, the potential of the signal line 109 becomes a High level by the operation of the CMOS inverter circuit 110-2.

Further, in the next detection timing of the light receiving element 102, in the case where the potential of the first signal line 103 is equal to that of the second power supply line 105, the second signal line 106 is short-circuited to the first power supply line 104. With this configuration, the potential of the second signal line 106 becomes a High level; further, the potential of the signal line 109 becomes a Low level. In this manner, the light receiving circuit 114 inverts the potential of the output signal each time the optical signal from the optical transmission path 101 is detected.

Figure 3:
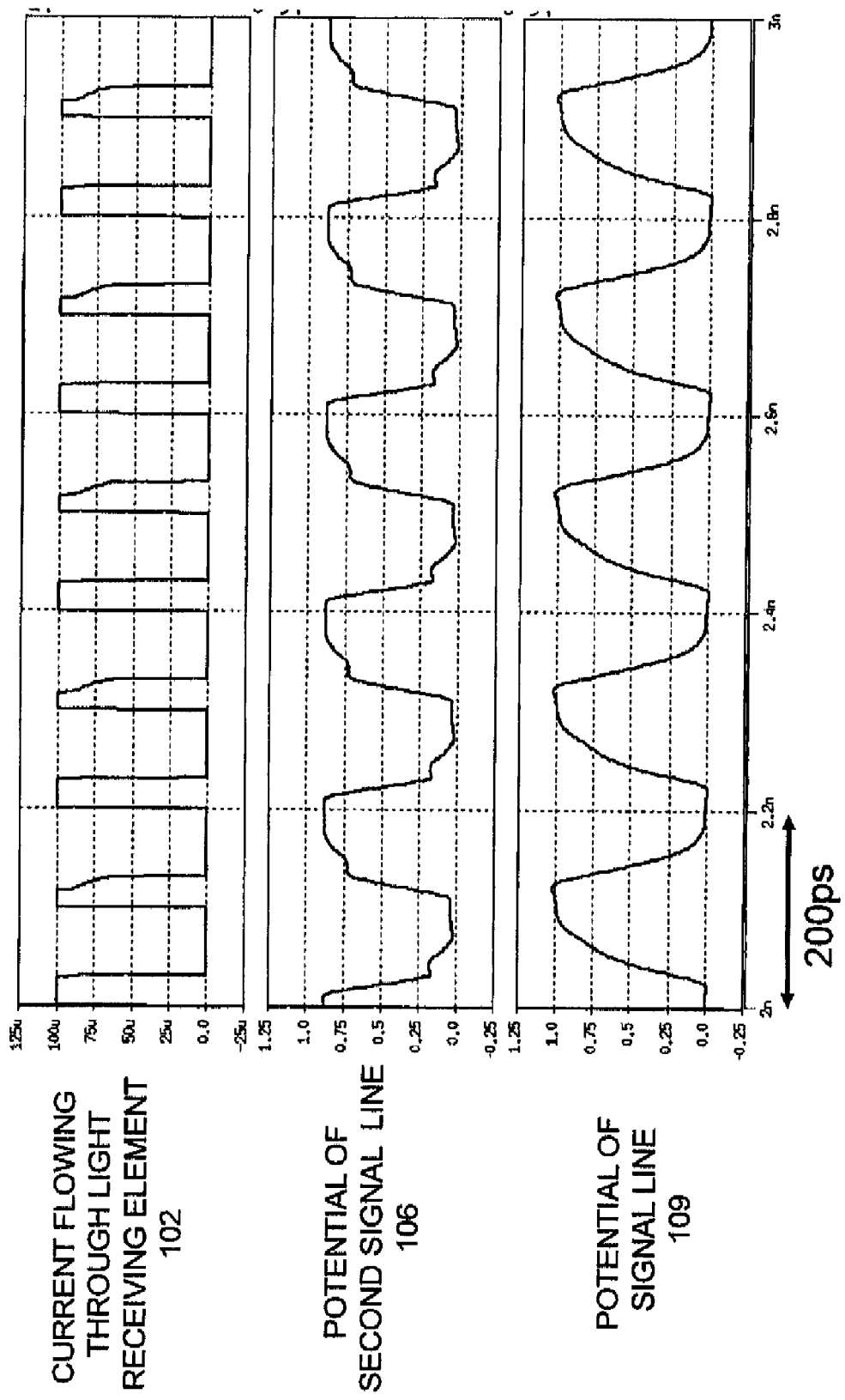
FIG. 3 is an explanation view of waveforms of internal signals in the first specific example.

FIG. 3 shows signal waveforms obtained by the present specific example. Of the three waveforms shown in FIG. 3, a top waveform represents transition of an amount of current flowing through the light receiving element 102. In the waveform, timing in which a value increases corresponds to timing in which the light receiving element 102 detects the optical signal. Furthermore, a middle waveform represents transition of the potential of the second signal line 106, and a bottom waveform represents transition of the potential of the signal line 109.

Referring to FIG. 3, the potential of the second signal line 106 inverts each time the light receiving element 102 detects the optical signal. Further, the buffer circuit 110 operates following the inversion; and accordingly, it shows that the potential of the signal line 109 is inverted.

According to the light receiving circuit 114 of the present specific example, there may be provided one optical transmission path 101 which leads an optical signal and a light receiving element 102 which receives the optical signal; and therefore, a system circuit configuration can be simplified.

Figure 4:
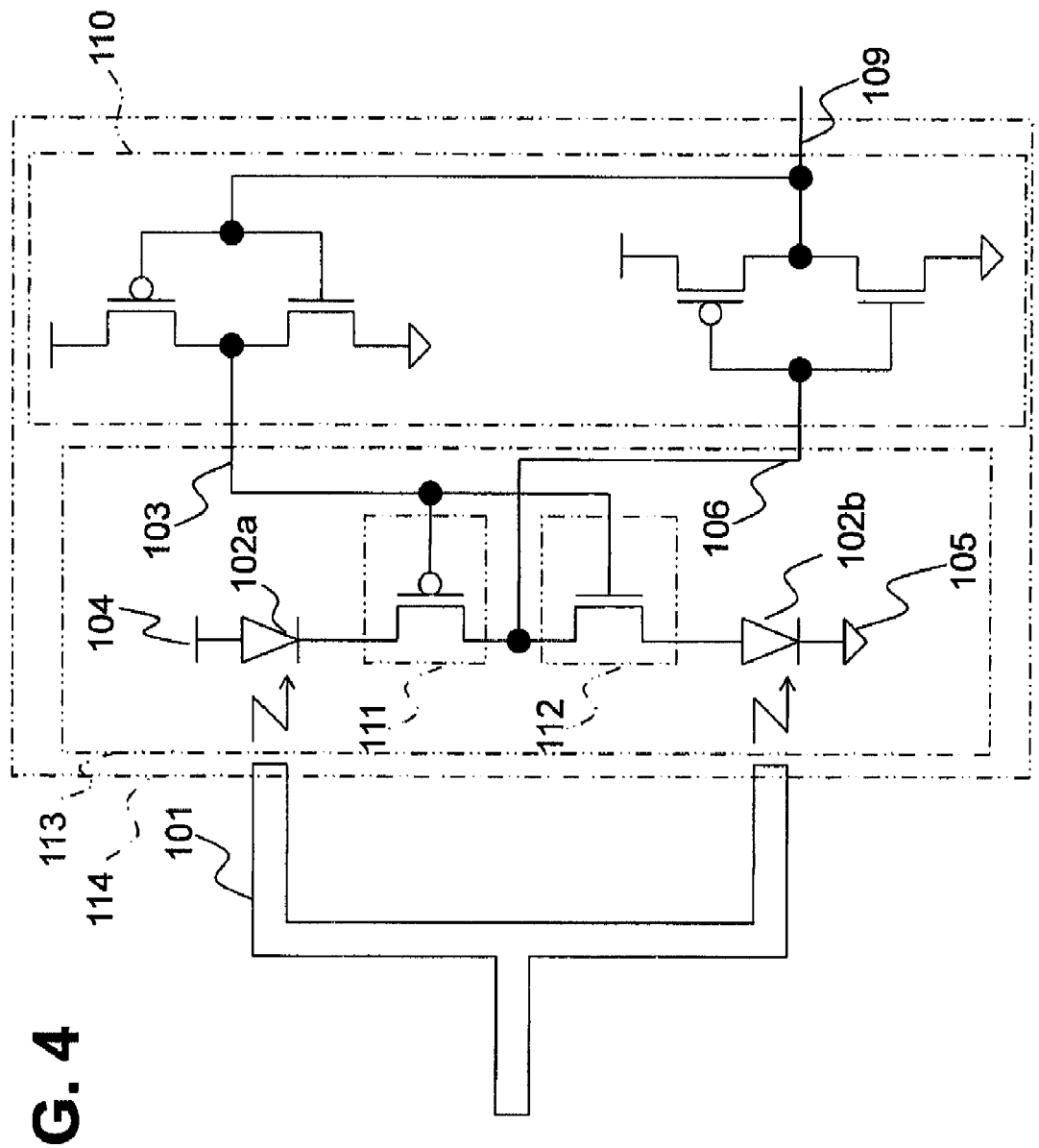
FIG. 4 is a circuit diagram of a second specific example according to the first embodiment.

FIG. 4 shows a second specific example. An internal configuration and input and output interconnection of a buffer circuit 110 in a light receiving circuit 114 of the present specific example are the same as the aforementioned first specific example (FIG. 2), and their description will be omitted.

As shown in FIG. 4, a light inputting circuit 113 of the present specific example includes two light receiving elements, one is a first light receiving element 102a and the other is a second light receiving element 102b; a first switching circuit 112 made up of an nMOS transistor; and a second switching circuit 111 made up of a pMOS transistor. Gate electrodes of both switching circuits 111 and 112 are connected to a first signal line 103 from the buffer circuit 110. In addition, optical signals to be respectively inputted to two light receiving elements 102a and 102b are one system optical pulse train from an optical transmission path 101, and there exist no difference in frequency and in phase between both signals.

The first light receiving element 102a has an anode side connected to a first power supply line 104 from an operational power supply, and a cathode side connected to a source electrode of the second switching circuit 111. A cathode side of the other second light receiving element 102b is connected to a second power supply line 105 from the ground; and an anode side thereof is connected to a source electrode of the first switching circuit 112. A second signal line 106 from the buffer circuit 110 is connected between a drain electrode of the second switching circuit 111 and a drain electrode of the first switching circuit 112.

In the light receiving circuit 114 having such configuration, when the optical signal is inputted to the first light receiving element 102a and the second light receiving element 102b, the first switching circuit 112 becomes in ON state and the second switching circuit 111 becomes in OFF state in the case where a potential of the first signal line 103 is equal to that of the first power supply line 104. In this case, the first light receiving element 102a is in OFF state, that is, current does not flow; and the second light receiving element 102b is in ON state where current flows.

In doing so, the second signal line 106 is short-circuited to the second power supply line 105 from the ground through the second light receiving element 102b; and accordingly, a potential of the second signal line 106 becomes a Low level. As a result, a potential of a signal line 109 becomes a High level.

Further, in the next input timing of the optical signal with respect to the first light receiving element 102a and the second light receiving element 102b, when the potential of the first signal line 103 is equal to that of the second power supply line 105 from the ground, the second switching circuit 111 is in ON state. In doing so, the second signal line 106 is short-circuited to the first power supply line 104 from the operational power supply through the first light receiving element 102a; and accordingly, the potential of the second signal line 106 becomes a High level. As a result, the potential of the signal line 109 becomes a Low level.

As described above, even in the configuration of the second specific example, the light receiving circuit 114 inverts an output level each time the optical signal from the optical transmission path 101 is detected.

Figure 5:
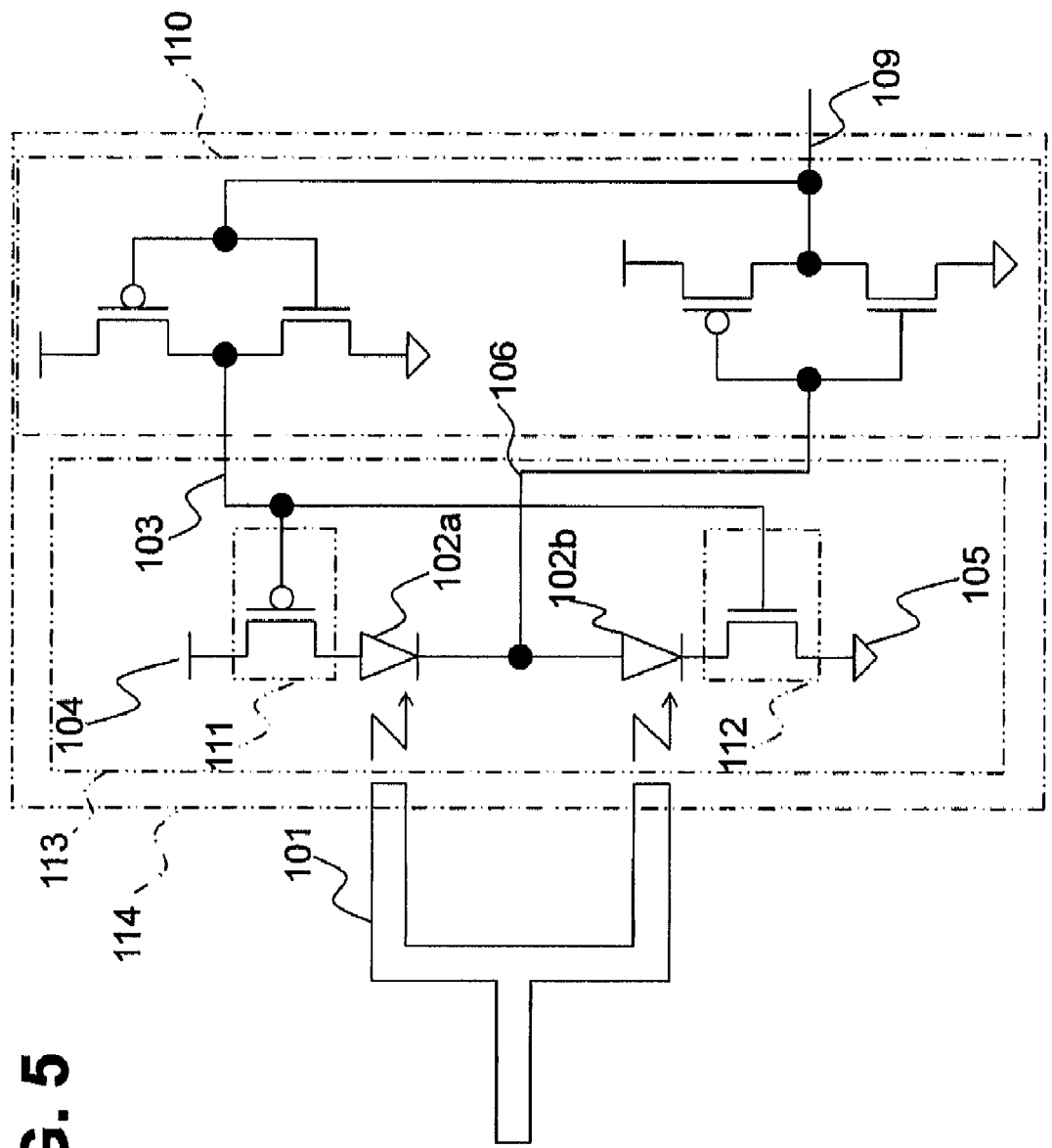
FIG. 5 is a circuit diagram of a third specific example according to the first embodiment.

In addition, a configuration of the light inputting circuit 113 may be one in which an arrangement of two light receiving elements (102a and 102b) and two switching circuits (111 and 112) is replaced; and its configuration is shown in FIG. 5 as a third specific example.

It is seen from FIG. 5 that a second switching circuit 111 has a source electrode connected to a first power supply line 104 from an operational power supply, and a drain electrode connected to an anode side of the first light receiving element 102a. A cathode side of the first light receiving element 102a is connected to an anode side of the other second light receiving element 102b; and a second signal line 106 from a buffer circuit 110 is connected between both light receiving elements 102a and 102b. Furthermore, a first switching circuit 112 has a drain electrode connected to a cathode side of a second light receiving element 102b, and a source electrode connected to a second power supply line 105 from the ground.

The operation according to the circuit configuration of the present specific example is the same as that of the second specific example (FIG. 4), and their description will be omitted.

According to the described second and third specific examples, each of the two switching circuits (111 and 112) of the light inputting circuit 113 is a simple circuit configuration which is made up of a single transistor; and therefore, it becomes possible to perform a switching operation rapidly. Consequently, the second and the third specific examples are suitable for a transmission system where high-speed property is required in converting from an optical signal to an electrical signal.

Figure 6:
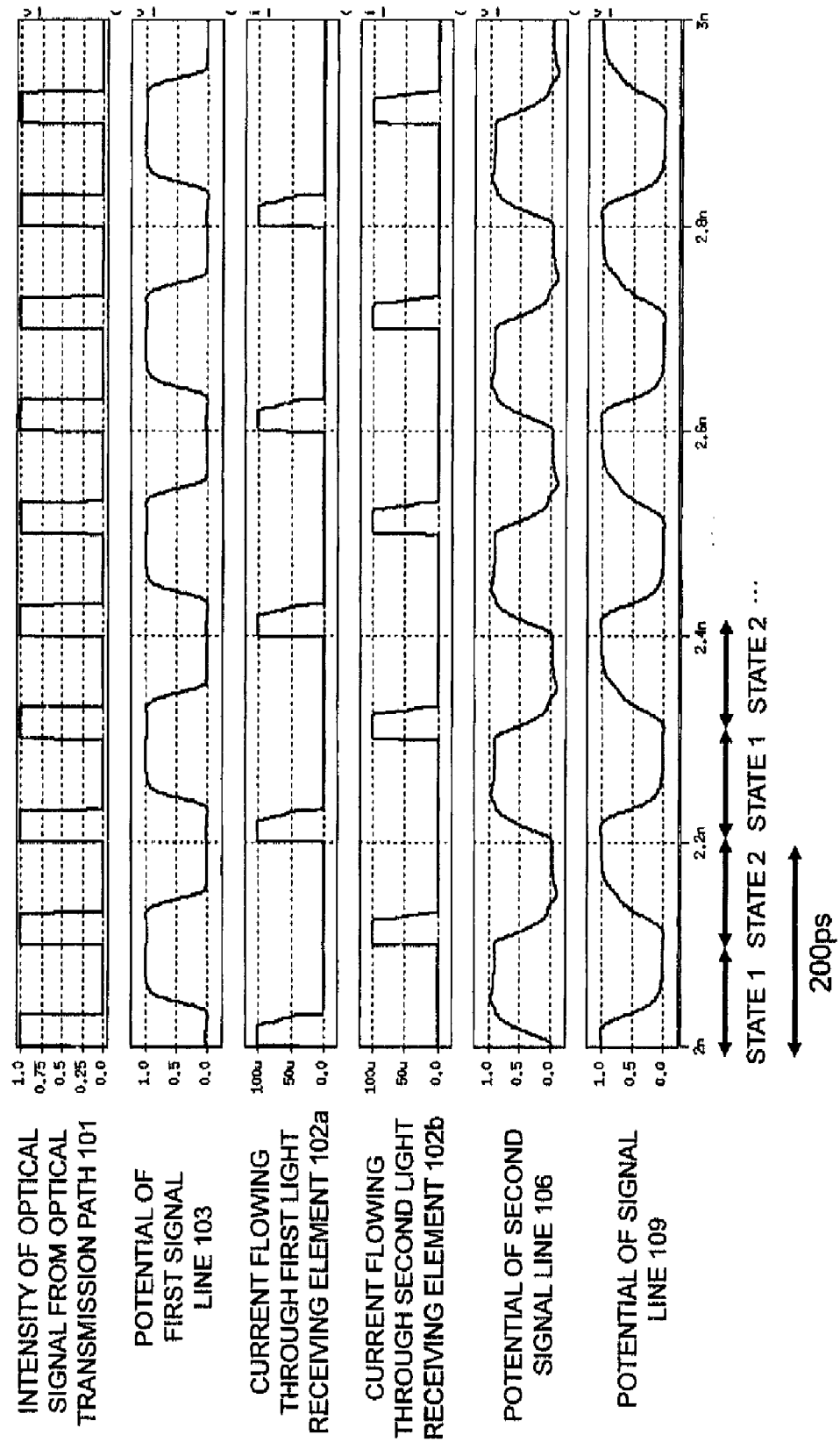
FIG. 6 is an explanation view of waveforms of internal signals in the second and the third specific examples.

FIG. 6 shows signal waveforms obtained from the second and the third specific examples. A top waveform shown in the drawing represents intensity of the optical signal in which the optical transmission path 101 outputs one after another. In addition, second, fifth, and sixth waveforms from the top shown in the same drawing represent potential transition of the first signal line 103, the second signal line 106, and the signal line 109, respectively. Further, third and fourth waveforms shown from the top in the same drawing represent transition of an amount of current flowing through two light receiving elements 102a and 102b, respectively.

Referring to FIG. 6, the light receiving circuit 114 repeats two states of a state 1 and a state 2 in response to a potential level of the first signal line 103. In this case, the state 1 means a state where the potential of the first signal line 103 is at a Low level; and the state 2 means a state where the same potential is at a High level.

In the state 1 where the first signal line 103 is at the Low level, as described above, the pMOS transistor of the second switching circuit 111 is in ON state; and the nMOS transistor of the first switching circuit 112 is in OFF state. Consequently, the second signal line 106 is short-circuited to the first power supply line 104 from the operational power supply. At this time, current flows through the first light receiving element 102a which detected the optical signal; and accordingly, the potential of the second signal line 106 changes to a High level.

Subsequently, the first signal line 103 changes to a High level by the aforementioned operation of the state 1. When transition to the state 2 occurs, the second switching circuit 111 becomes an OFF state, and the first switching circuit 112 becomes an ON state. With this operation, the second signal line 106 is short-circuited to the second power supply line 105 from the ground. Then, at this time, current flows through the second light receiving element 102b which detected the optical signal; and accordingly, the potential of the second signal line 106 changes to a Low level.

It is seen from FIG. 6 that, in the light receiving circuit 114, two light receiving elements 102a and 102b alternatively detect the optical signal, and the potential of the second signal line 106 is inverted for each detection. Further, the buffer circuit 110 is actuated in response to the operation; and accordingly, the potential of the signal line 109 is inverted.

Second Embodiment

Figure 7:
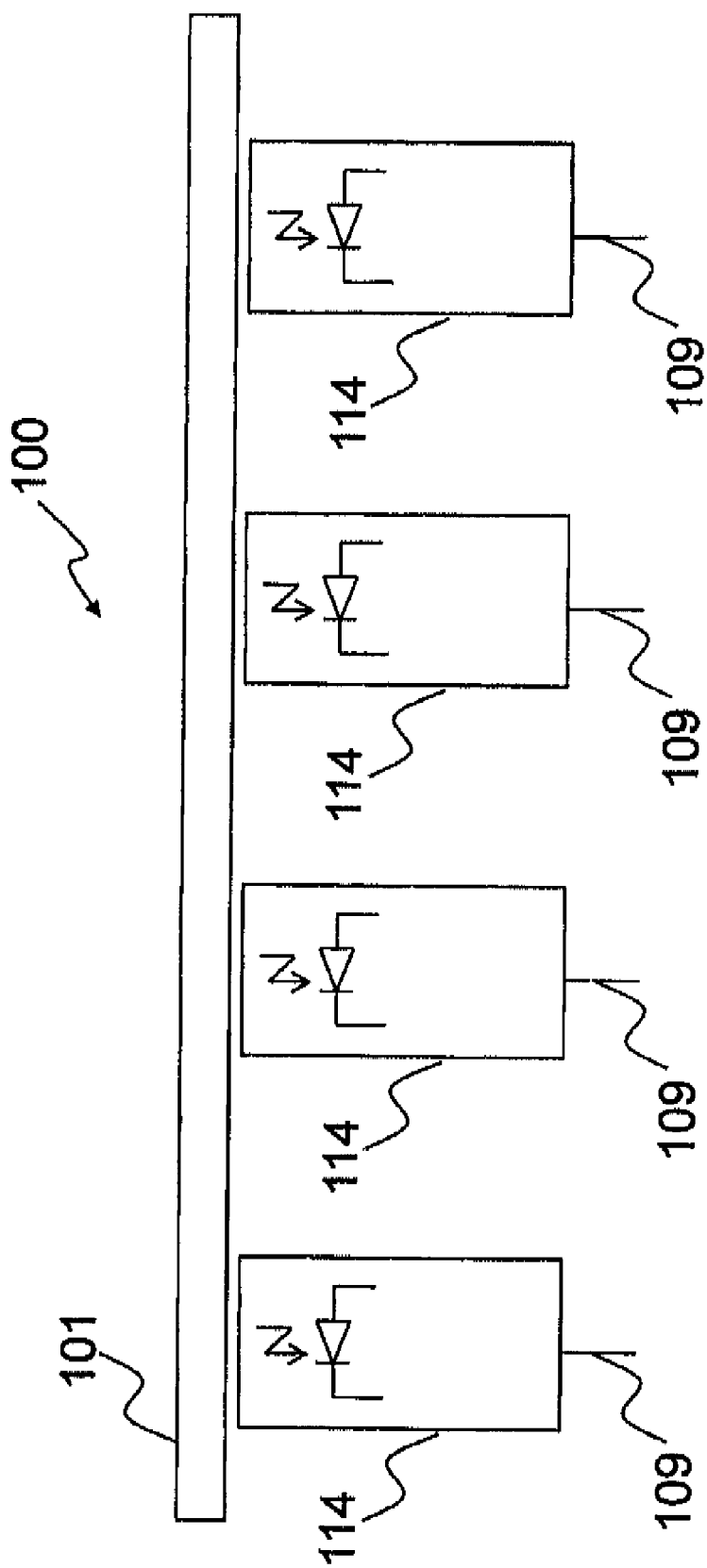
FIG. 7 is a circuit diagram of a second embodiment of the present invention.

FIG. 7 shows a second embodiment according to the present invention. The present embodiment is a digital system 100 in which a plurality of the aforementioned light receiving circuits 114 are prepared and arranged so as to receive optical signals from one optical transmission path 101. In addition, an aspect of the optical transmission path 101 does not need to be a straight line as shown in the drawing; but, it may be branched in a tree shape. According to such configuration, potential levels of the respective signal lines 109 are inverted each time the optical signal from the optical transmission path 101 is detected by all the light receiving circuits 114.

The present embodiment is suitable for distributing clock signals in a semiconductor integrated circuit, for example. If the configuration shown in FIG. 7 is adopted in the semiconductor integrated circuit, the clock signals can be propagated to a plurality of points by one system optical signal from the optical transmission path 101 without providing a circuit which inputs two system optical signals having a phase difference.

Furthermore, an optical transmission path with a multi-drop type bus structure can be applied to the optical transmission path 101. With this configuration, signals in the bus can be converted to light. Further, long distance interconnection can be replaced with the optical transmission path by the present embodiment.

Third Embodiment

Figure 8:
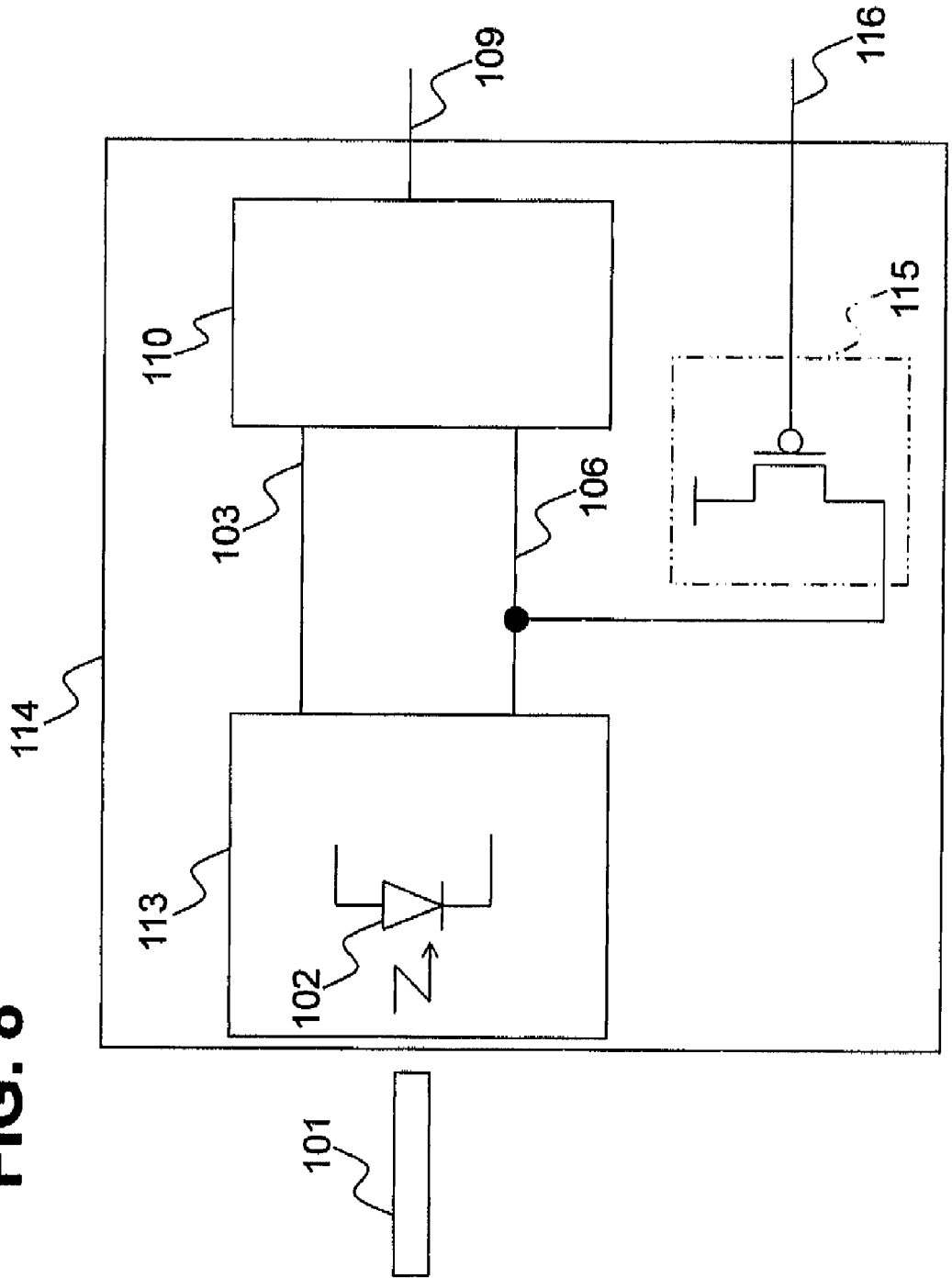
FIG. 8 is a circuit diagram of a third embodiment of the present invention.

FIG. 8 shows a third embodiment according to the present invention. The present embodiment is one in which a reset circuit 115 made up of a pMOS transistor and a reset signal line 116 which is for giving a reset signal to a gate electrode of the reset circuit 115 are added to the aforementioned light receiving circuit 114. In adding the reset circuit 115 to a light inputting circuit 113, a drain electrode of the pMOS transistor is connected to a second signal line 106.

In such configuration, when a reset signal with a ground level is applied to the reset signal line 116, the pMOS transistor of the reset circuit 115 is in ON state. With this configuration, a potential of the second signal line 106 can be forcibly set to the ground level. In addition, this reset operation is to forcibly change the potential of the second signal line 106; and therefore, it is preferable that input of an optical signal from an optical transmission path 101 is cut off when resetting.

Fourth Embodiment

Figure 9:
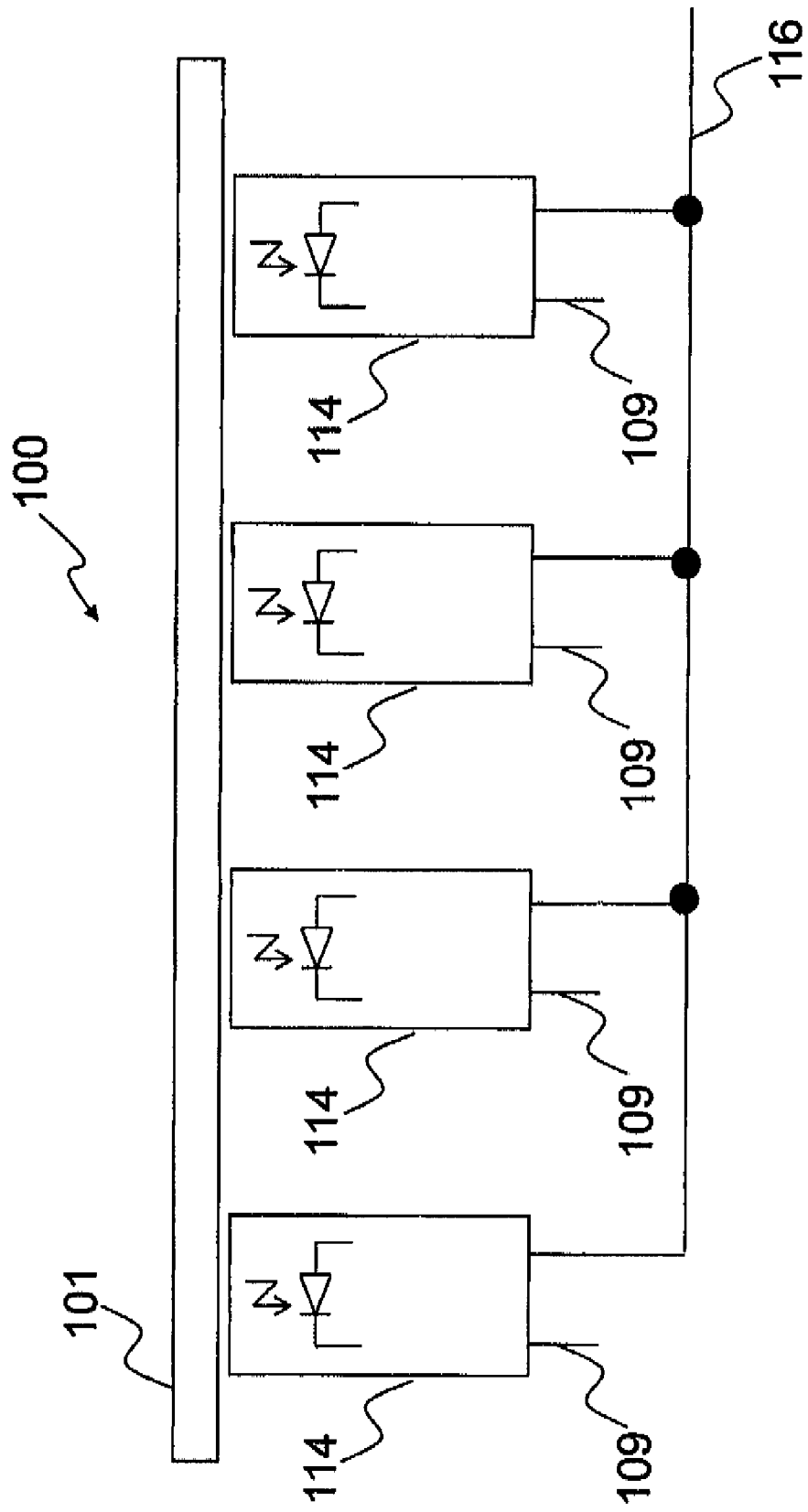
FIG. 9 is a circuit diagram of a fourth embodiment of the present invention.
Figure 10:
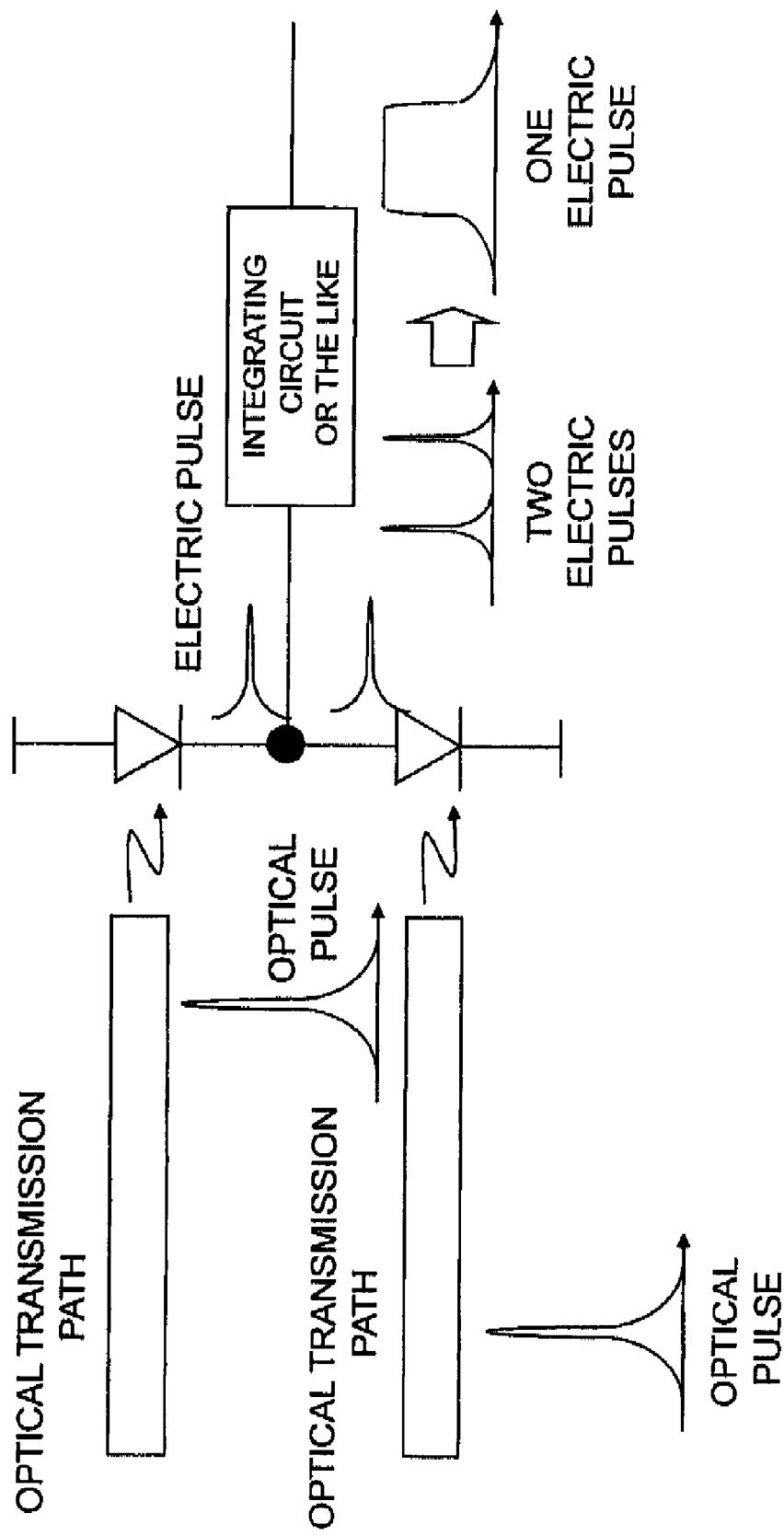
FIG. 10 is a circuit diagram of a general light receiving circuit.

FIG. 9 shows a fourth embodiment according to the present invention. The present embodiment is one in which the light receiving circuit 114 shown in FIG. 8 is applied to the digital system 100 shown in FIG. 7; that is, a configuration in which a plurality of the light receiving circuits 114 each having a reset circuit 115 with respect to the optical transmission path 101 are arranged.

In such configuration, all the reset signal lines 116 are connected in parallel; and accordingly, a reset process can be collectively performed with respect to all the light receiving circuits 114. The reset process can be easily performed with respect to all distribution by applying the present embodiment to distribution control of clock signals in an LSI, for example.

According to the respective embodiments of the above described present invention, potential difference across both terminals of the light receiving element (102) is scarcely changed; and therefore, there is an advantage in that operation speed of the light receiving circuit 114 is not reduced even there is parasitic capacitance between both terminals of the light emitting elements (102). Furthermore, particularly, in the configurations shown in FIGS. 4 and 5, since potentials across both terminals of the respective light receiving elements (102a and 102b) are also scarcely changed, there is no influence on the operation speed of the light receiving circuit 114 even there exists parasitic capacitance between the terminals of the respective light receiving elements (102a and 102b) and the first or the second power supply line (104 or 105).

Fifth Embodiment

Figure 11:
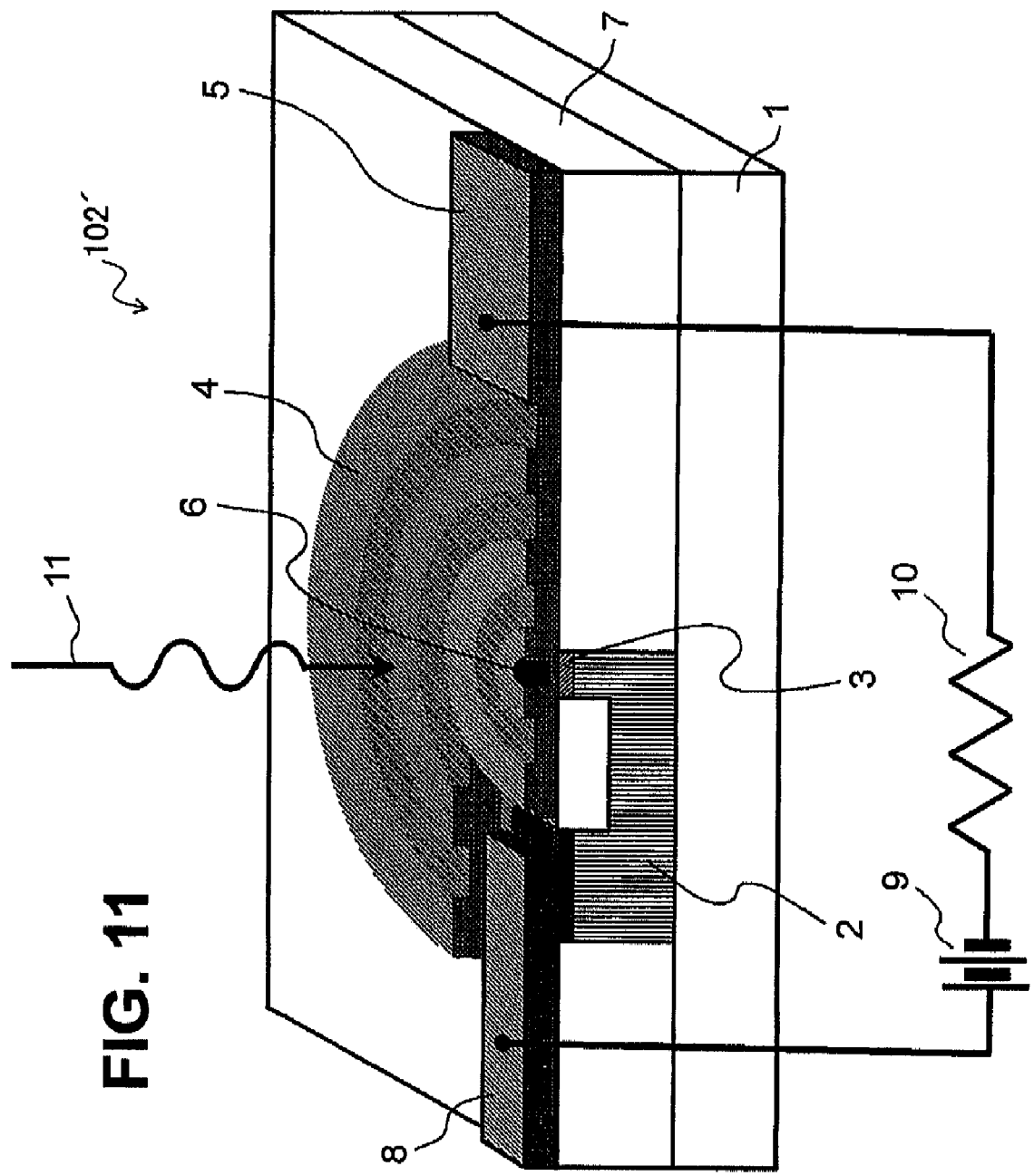
FIG. 11 is a perspective view showing a sectional structure of a photodiode for use in a fifth embodiment of the present invention.
Figure 12:
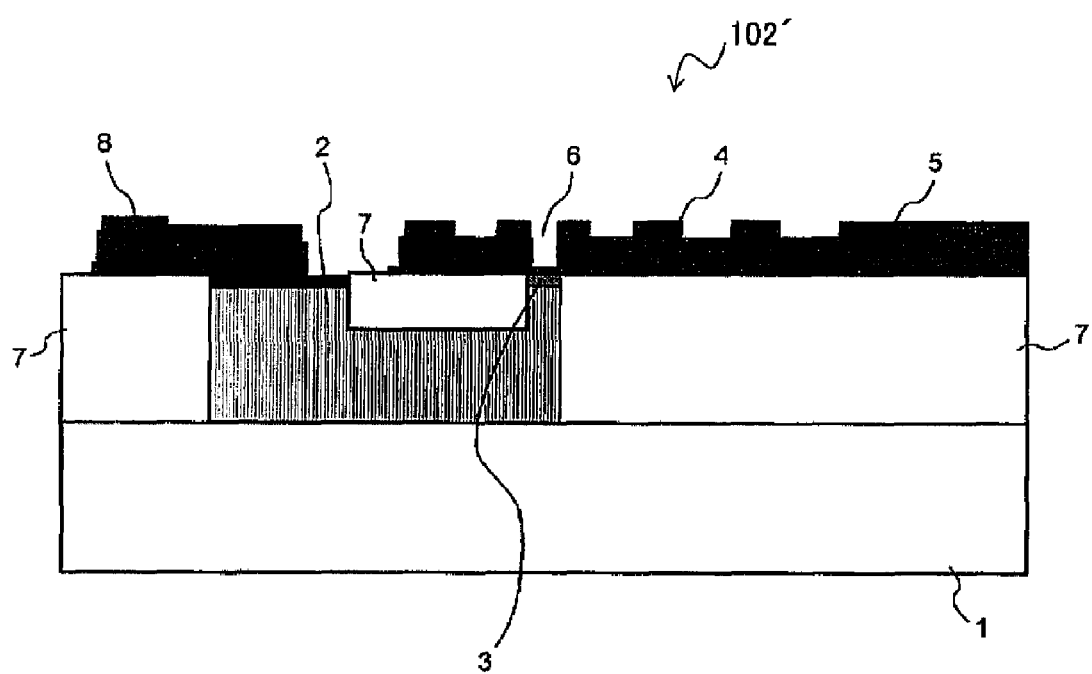
FIG. 12 is a sectional view of the photodiode for use in the fifth embodiment.

A fifth embodiment of the present invention is an embodiment in which a Schottky photodiode 102' shown in FIG. 11 is used as a light receiving element (102) in the aforementioned embodiments. FIG. 11 is a perspective view including a section of the photodiode 102'; and FIG. 12 is an enlarged view showing its section.

The Schottky photodiode 102' shown in the drawing includes an n+ type semiconductor layer 2 formed on a part of a substrate 1 whose surface has insulation property, such as silicon on insulator (referred to as SOI); an n− type semiconductor layer 3 provided on the upper part of the n+ type semiconductor layer 2; a metal periodic structure 4 which comes in contact with the n− type semiconductor layer 3; a first electrode (anode electrode) 5 connected to the metal periodic structure 4; a second electrode (cathode electrode) 8 which is opposed to the first electrode 5 and comes in contact with the n+ type semiconductor layer 2; a bias power supply 9 which applies a reverse bias potential between the first electrode 5 and the second electrode 8; and a resistive load 10 inserted between the bias power supply 9 and the first electrode 5.

An opening 6 which does not pass through is provided in the metal periodic structure 4. It is preferable that a bottom portion of the opening 6 does not pass through to the n− type semiconductor layer 3 side as in the present embodiment; however, it is all right to pass through by a minute hole like a pin hole. The metal periodic structure 4 comes in contact with the n− type semiconductor layer 3 at the opening 6 and in the vicinity thereof. The n− type semiconductor layer 3 is formed at a portion of the n+ type semiconductor layer 2 which comes in contact with the opening 6 of the metal periodic structure 4 and the vicinity thereof. Furthermore, an insulation layer 7 is provided between the metal periodic structure 4 and the n+ type semiconductor layer 2 or the substrate 1. The first electrode 5 is provided on the insulation layer 7 and connected to the metal periodic structure 4. In addition, the second electrode 8 is also provided on the insulation layer 7. The n+ type semiconductor layer 2 has a part exposed to the upper surface of the insulation layer 7 passing through the insulation layer 7, and jointed to the second electrode 8 at that position.

With respect to the Schottky photodiode 102', signal light 11 is made incident on the metal periodic structure 4 serving as a metal film which scarcely passes light. When the signal light 11 excites surface plasmon in the metal periodic structure 4 and combines with the surface plasmon, a resonance state between the signal light 11 and the surface plasmon is made by a concave-convex periodic structure of the metal periodic structure 4. By the generation of the resonance state, strong near-field light is generated at a light incident plane of the opening 6 of the metal periodic structure 4 and in the vicinity of the n− type semiconductor layer 3 on the opposite side. The near-field light generates photovoltaic power at a depletion layer associated with a Schottky barrier in the vicinity of the opening 6 on the n− type semiconductor layer 3 side by generating electron-hole pair. The intensity of the signal light 11 is converted to a potential difference across the both ends of the resistive load 10.

As described above, in the bottom of the metal periodic structure 4, the n+ type semiconductor layer 2 whose electrical conductivity is high and the n− type semiconductor layer 3 formed on a part of the n+ type semiconductor layer 2 are formed on the substrate 1. The n+ type semiconductor layer 2 is obtained by injecting an impurity ion of not lower than $1 \times 10^{20}$ cm$^{-3}$ with respect to Si, for example. The n− type semiconductor layer 3 can be formed by performing epitaxial growth of semiconductor crystal containing an impurity ion of approximately $1 \times 10^{17}$ cm$^{-3}$ on the n+ type semiconductor layer 2.

The metal periodic structure 4 is formed by material which is low in plasmon loss, such as silver (Ag), gold (Au), or the like. The opening 6 is provided at the central portion of the metal periodic structure 4; however, a periodic structure by concentric concave-convex centered at the opening 6 is formed in the metal periodic structure 4. Polarization dependent property of the signal light 11 can be reduced by forming the concentric concave-convex. A period of the concave-convex of the metal periodic structure 4 is set to a value which is a little bit shorter than a period of the signal light 11 in accordance with a resonance wavelength of the surface plasmon. For example, in the case where the wavelength of the signal light 11 is 800 nm, the period of the concave-convex is approximately 600 nm. Furthermore, the depth of the concave-convex is set to approximately 20 nm to 200 nm; and accordingly, an effect by the surface plasmon resonance comes out. The bottom portion of the opening 6, where a film thickness of the metal periodic structure 4 is the thinnest, is preferable to be not lower than 100 nm that can substantially block light transmission. However, when the thickness is too thick, the near-field light in the vicinity of the opening 6 becomes weak; and therefore, the thickness is set to not higher than 1000 nm (1 μm). Since the first electrode 5 is connected to the metal periodic structure 4 on the insulation layer 7, the first electrode 5 may be simultaneously formed with the metal periodic structure 4 using the same material as the metal periodic structure 4.

A concave-convex shape in the metal periodic structure 4 is not limited to a rectangular section shown in FIG. 12; for example, the convex portion may be formed in a pointed shape and in a triangle shape in section, or a side surface of the convex portion may have a curved surface, and moreover, a corner thereof may be rounded (dome shape). Even shapes other than such rectangular sections, the effect by the surface plasmon resonance can be similarly obtained. In addition, a ratio between the length of the concave portion and that of the convex portion can be arbitrarily set. Even one period of the concentric concave-convex is provided, that is, even if only one fold annular structure surrounding the opening 6 is formed, a certain level of effect is obtained. However, larger effect of the surface plasmon resonance can be obtained by setting to be not less than three periods, that is, not less than threefold concentric structure. The signal light 11 is irradiated to the entire or a part of the metal periodic structure 4.

A region where the n− type semiconductor layer 3 comes in contact with the metal periodic structure 4 is set to be substantially overlapped with a region of the opening 6. Generally, there is many that a generating region of the near-field light appeared in the vicinity of a minute opening is a little bit larger than a diameter of the opening. For this reason, usually, a joint region of the metal periodic structure 4 and the n− type semiconductor layer is set to be larger by the degree of lithography positioning error, that is, by the degree of 10 nm to 500 nm on one side than the diameter of the opening 6. On the contrary, even when the opening 6 is formed out of the joint region and a part of the near-field light appears outside the n− type semiconductor layer 3, it is possible to operate as the photodiode.

As described above, the opening 6 of the present embodiment is formed so as not to pass through the metal periodic structure 4. In more detail, a metal layer having a thickness of approximately 10 nm or below is remained at the bottom of the opening 6. The metal layer of the bottom portion is made of material which is low in surface plasmon loss, such as Ag, Au, or the like that forms the metal periodic structure 4; an adhesion layer such as chromium (Cr); or these layered structure. The Schottky barrier appears along a boundary between the metal periodic structure 4 and the n− type semiconductor layer 3. Propagation distance of the near-field light is not higher than approximately 100 nm, and a region where the intensity of the near-field light is the strongest is localized at a position of approximately 10 nm depth of the n− type semiconductor layer 3. Calculative width of a depletion layer due to the Schottky barrier is approximately 100 nm in the case of Si in which donor impurity concentration is set to $1 \times 10^{17}$ cm$^{-3}$. Consequently, the thickness of the n− type semiconductor layer 3 can be not higher than 50 nm by further increasing the donor impurity concentration.

The n+ type semiconductor layer 2 has a high doping concentration of impurities of not lower than $1 \times 10^{20}$ cm$^{-3}$ and forms ohmic contact with the second electrode 8. In this regard, however, even when the doping concentration in the n+ type semiconductor layer 2 is a little bit lower than $1 \times 10^{20}$ cm$^{-3}$, if a height of a Schottky barrier formed by the n+ type semiconductor layer 2 and the second electrode 8 is relatively lower than the Schottky barrier between the metal periodic structure 4 and the n− type semiconductor layer 3, the photodiode operation as in the above description is obtained.

The first electrode 5 and the second electrode 8 are connected to the resistive load 10 via the bias power supply 9; and therefore, the intensity of the signal light 11 is converted to a potential difference across the both ends of the resistive load 10 in such circuit configuration.

Figure 13:
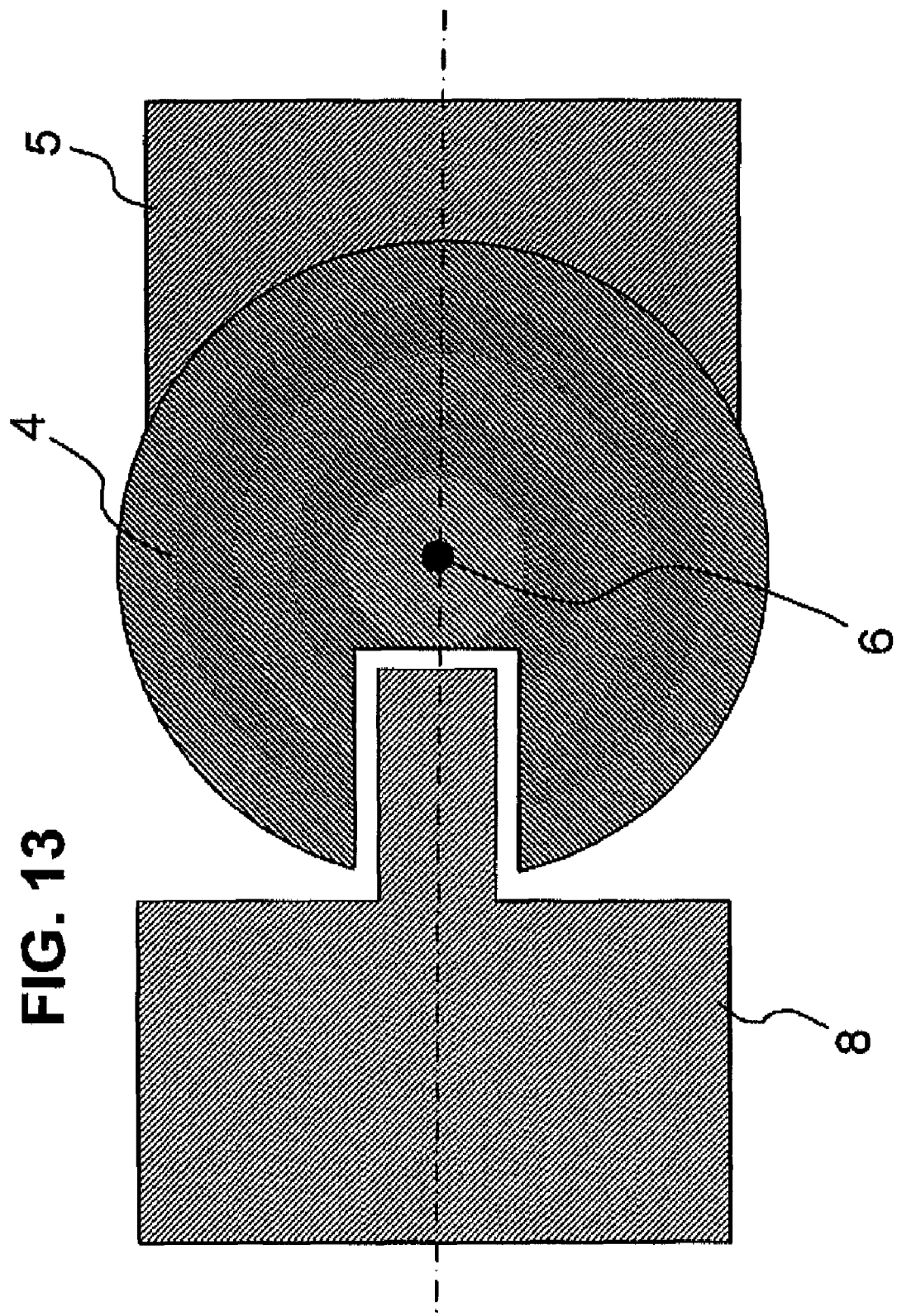
FIG. 13 is a top plan view showing an example an electrode arrangement of the photodiode for use in the fifth embodiment.

FIG. 13 shows one example of a mutual positional relation among the metal periodic structure 4, the first electrode 5, and the second electrode 8 on the insulation layer 7. In the shown example, the first electrode 5 and the second electrode 8 exist on the same plane; however, these do not need to be formed on the same plane. The second electrode 8 is arranged in a shape so as to enter into a place where a part of the concentric concave-convex of the metal periodic structure 4 is cut out. Furthermore, the second electrode 8 does not need to enhance plasmon; and therefore, it is not required to use the same material as the first electrode 5, such as Ag, Au, or the like; however, for example, there can be used copper (Cu), nickel (Ni), tungsten (W), aluminum (Al), or the like. As shown in FIG. 13, a cutout is made at a part of the metal periodic structure 4 and the second electrode 8 which pairs with the first electrode 5 is arranged at the cutout place; and accordingly, a width of the n+ type semiconductor layer 2, that is, a distance between the opening 6 and the second electrode 8 can be narrowed. With this configuration, response operation of the Schottky photodiode 102' with respect to an optical signal can be speeding up.

The near-field light is remarkably enhanced by the surface plasmon resonance in the case where the diameter of the opening 6 is approximately ½ to 1/10 of a wavelength of the signal light if the shape of the opening 6 is a circle as shown. Because, in the case where the opening 6 is nearly equal to or larger than the wavelength, most of photon energy passes through the opening 6 as transmission light; and therefore, the energy cannot be confined as the near-field light. Furthermore, when the diameter of the opening 6 is smaller than 1/100 of the wavelength of the signal light, even if the plasmon enhancement is used, energy transmission to the n− type semiconductor layer 3 side via the opening 6 is small and most of the photon energy is reflected by the opening 6. Therefore, in the case of using signal light having a wavelength of 800 nm, for example, it is preferable that the diameter of the opening 6 is approximately 80 nm to 400 nm. The opening 6 may be shaped in a different shape, such as a quadrangular cylinder shape, a hexagonal cylinder shape, an elliptical cylinder shape, or the like other than a cylindrical shape.

As described above, the metal periodic structure 4 comes in contact with the n− type semiconductor layer 3 only in the vicinity of the opening 6; and at different places, there exists the insulation layer 7 between the metal periodic structure 4 and the respective semiconductor layers. The configuration is a configuration based on that a depletion layer at a range out of reach of light does not contribute to photovoltaic power but the depletion layer is only contributory to dark current. As the insulation layer 7, there can be used a material for use in a usual semiconductor process, such as silicon dioxide ($SiO_2$). Furthermore, the metal periodic structure 4 and the n− type semiconductor layer 3 form an unnecessary parasitic capacitance at the outside of the depletion layer; and accordingly, when the whole capacitance increases, circuit response speed is reduced. Therefore, the insulation layer 7 needs to be set as thick as possible in order to decrease the dark current and enhance the response speed. Preferably, it is desired to be a thickness of not lower than 500 nm and a value of the parasitic capacitance of not higher than 1 fF. In order to reduce the parasitic capacitance, it is effective to use a low dielectric constant insulating film such as fluorinated silicon oxide (SiOF), carbon-incorporated silicon oxide (SiOC), or the like in which fluorine (F), carbon (C), or the like is doped to $SiO_2$ as a material of the insulation layer 7.

Furthermore, in the case of a configuration where the opening 6 provided in the metal periodic structure 4 is completely passed through and the bottom of the metal periodic structure 4 does not come in contact with the n− type semiconductor layer 3, and in order to form a Schottky connection, if the n− type semiconductor layer 3 is set to be larger than the diameter of the opening 6 and the diameter of the opening 6 is not higher than a half of the wavelength, an amount of light transmitting through the opening 6 becomes a very little. At this time, a photon appeared on the n− type semiconductor layer 3 side via the opening 6 is substantially a near-field light state. Therefore, even in the configuration where the opening 6 of the metal periodic structure 4 is passed through, there can be obtained a photodiode which performs the same operation as the case where there exists a metal at the bottom of the opening 6.

In the present embodiment, since a light receiving region of the light receiving element can be small, it becomes possible to reduce element capacity and to decrease carrier traveling time. With this configuration, high speed electrical response can also be made with respect to a high speed optical pulse.

Specific examples of the present embodiment are made by applying the aforementioned Schottky photodiode 102' to the specific configurations of the first embodiment shown in FIGS. 2, 4, and 5. In the specific examples, the Schottky photodiode 102' serving as the light receiving element (102) detects an optical signal; and accordingly, the light receiving circuit (114) detects the optical signal from the optical transmission path (101), and inverts a potential of an output signal. It becomes possible to detect a faster optical signal by using the Schottky photodiode 102' serving as the light receiving element (102). Furthermore, since condenser efficiency of the optical signal is enhanced by using the Schottky photodiode 102', tolerance with regard to interspace matching between the optical transmission path (101) and the light receiving element (102) can be extended.

In addition, a positional relation between the first electrode 5 and the second electrode 8 and the metal periodic structure 4 in the Schottky photodiode 102' and their shapes are not limited to the aspect shown in FIG. 13; however, there may be adopted configurations to be described below shown in FIGS. 14, 15, and 16.

Figure 14:
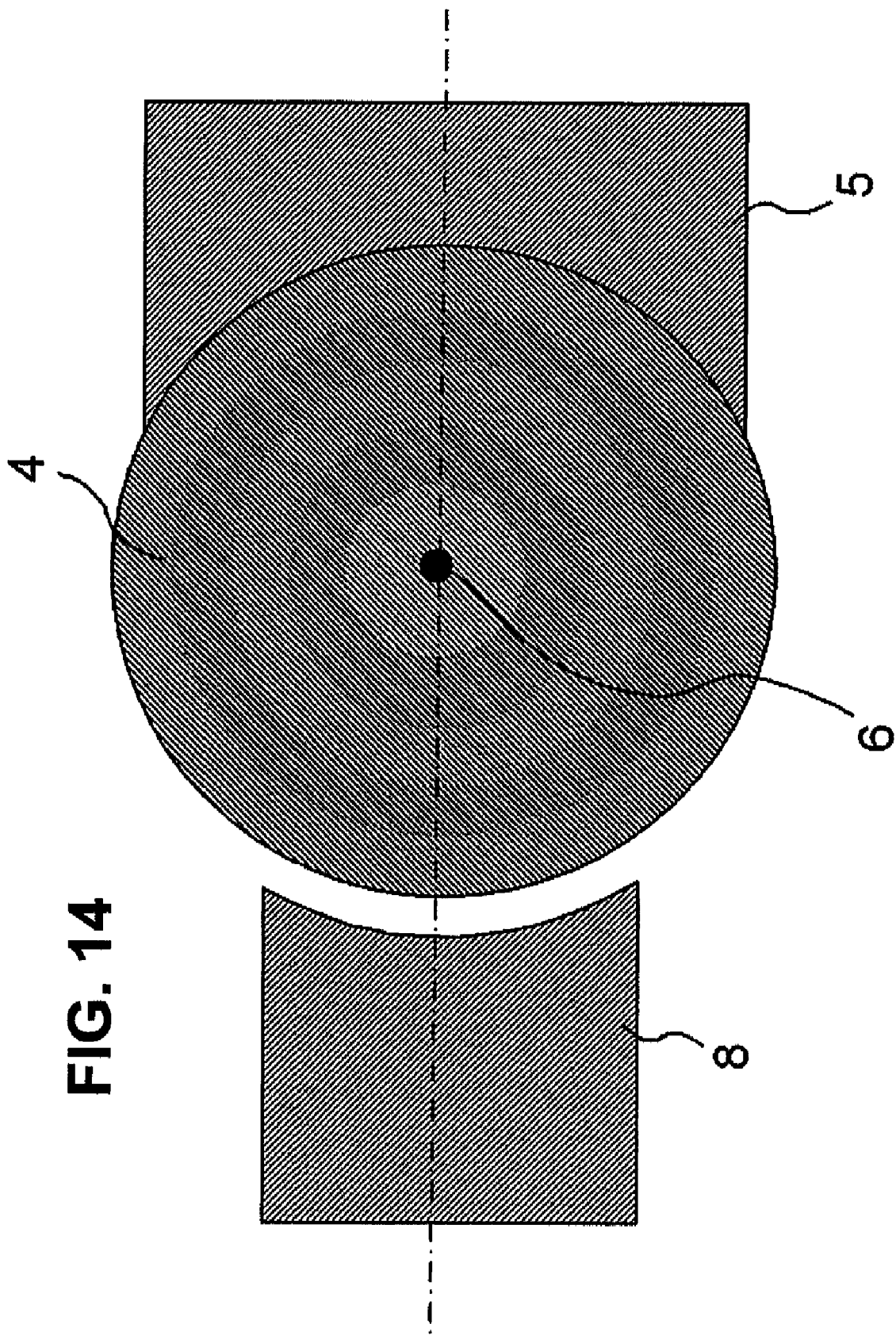
FIG. 14 is a plan view showing other example of an electrode arrangement of a photodiode for use in the fifth embodiment.

A configuration shown in FIG. 14 is that a cutout is not made in a metal periodic structure 4 having concentric concave-convex, but a second electrode 8 is arranged in the vicinity of the metal periodic structure 4. According to the configuration shown in the drawing, since there is not a lack in the concentric shape of the concave-convex formed in the metal periodic structure 4, polarization dependent property of incident light can be further reduced.

Figure 15:
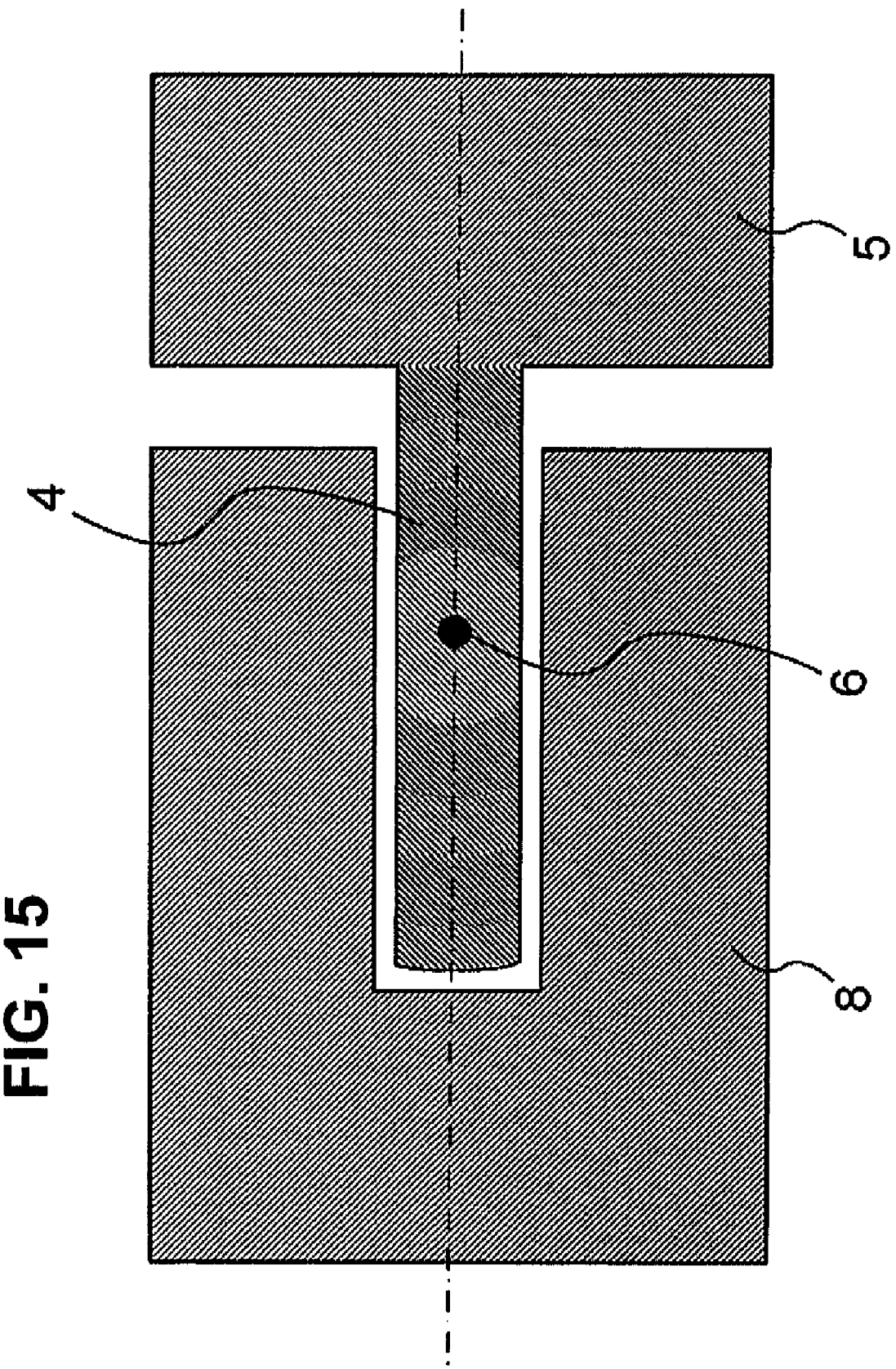
FIG. 15 is a plan view showing other example of an electrode arrangement of a photodiode for use in the fifth embodiment.

A configuration shown in FIG. 15 is that a metal periodic structure 4 having concentric concave-convex as shown in FIG. 14 is cut in a band shape including an opening 6, and the same is surrounded by a first electrode 5 and a second electrode 8. The first electrode 5 is connected to one end of the metal periodic structure 4; whereas, the second electrode 8 is arranged in the vicinity of the metal periodic structure 4 so as to surround ends of the metal periodic structure 4 which are not connected to the first electrode 5. According to such configuration, a response to specific polarization can be speeding up like a polarization in a longitudinal direction of the metal periodic structure 4, that is, a polarization having an electric field component in a lateral direction shown in FIG. 15.

Figure 16:
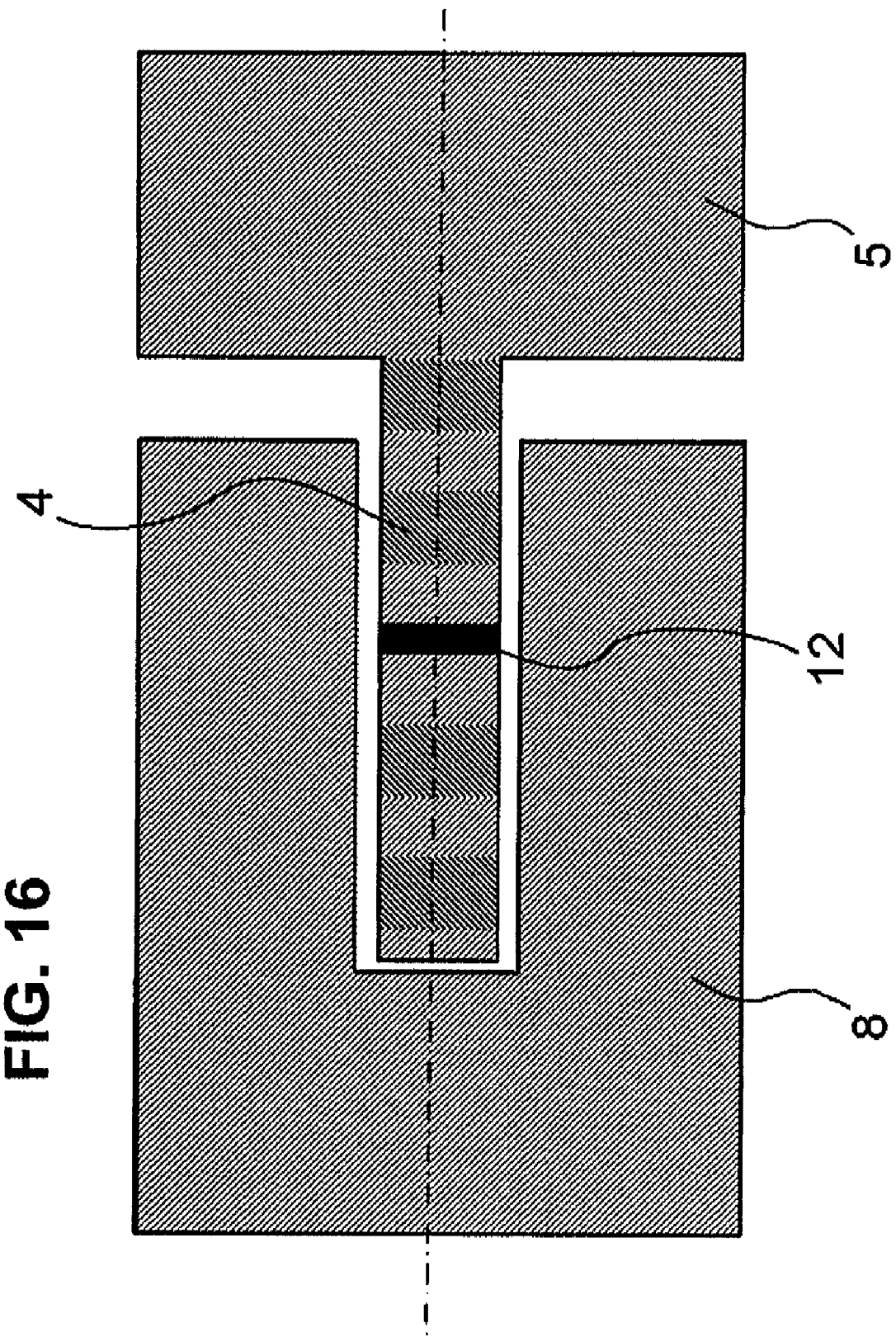
FIG. 16 is a plan view showing other example of an electrode arrangement of a photodiode for use in the fifth embodiment.

A configuration shown in FIG. 16 is that concave-convex in the band-shaped metal periodic structure 4 shown in FIG. 15 are formed in parallel in place of the concentric shape. Furthermore, a rectangular slit 12 in parallel to the concave-convex is formed in the center of the metal periodic structure 4 in place of the opening 6. According to such configuration, an increase in light receiving efficiency can be expected by forming the slit 12 which crosses the lateral direction of the band-shaped metal periodic structure 4.

If the above described Schottky photodiode 102' is applied to the aforementioned second embodiment (FIG. 7), the digital system (100) based on the embodiment shown in FIG. 9 can cope with a faster clock signal.

The invention claimed is:
1. A light receiving circuit comprising:
a light inputting circuit converting a one-system optical signal to be outputted from an optical transmission path to an electrical signal and inverting a potential of the electrical signal each time the optical signal is detected; and
a buffer circuit amplifying the electrical signal converted by the light inputting circuit and outputting the electrical signal,
wherein the light inputting circuit includes:
a light receiving element detecting the optical signal from the optical transmission path;
a first switching circuit being connected to a second signal line which transmits the electrical signal to the buffer circuit, a first signal line to which the same potential as a potential of the second signal line is given, and a power supply line from a ground; and a second switching circuit being connected to the second signal line, the first signal line, and a power supply line from an operational power supply, wherein the first switching circuit makes the second signal line short-circuit to the power supply line from the ground in the case where the potential of the first signal line is equal to a potential of the power supply line from the operational power supply when the light receiving element detects the optical signal, and the second switching circuit makes the second signal line short-circuit to the power supply line from the operational power supply in the case where the potential of the first signal line is equal to a potential of the power supply line from the ground when the light receiving element detects the optical signal.

2. The light receiving circuit according to claim 1, wherein the first switching circuit has two nMOS transistors whose gate electrodes are connected to the first signal line, and the second switching circuit has two pMOS transistors whose gate electrodes are connected to the first signal line, wherein:

one of the two nMOS transistors has a drain electrode connected to an anode of the light receiving element and a source electrode connected to the power supply line from the ground, and the other thereof has a drain electrode connected to the second signal line and a source electrode connected to a cathode of the light receiving element; and one of the two pMOS transistors has a drain electrode connected to an anode of the light receiving element and a source electrode connected to the power supply line from the operational power supply, and the other thereof has a drain electrode connected to the second signal line and a source electrode connected to a cathode of the light receiving element.

3. The light receiving circuit according to claim 1, wherein the buffer circuit has a first inverter circuit in which the electrical signal converted by the light inputting circuit is inputted, and a second inverter circuit in which a potential corresponding to the electrical signal inputted to the first inverter circuit is transmitted to the light inputting circuit.

4. The light receiving circuit according to claim 1, further comprising a reset circuit changing a potential at the output end of the light inputting circuit with respect to the buffer circuit to a preliminarily set potential.

5. A light receiving circuit comprising:
a light inputting circuit converting a one-system optical signal to be outputted from an optical transmission path to an electrical signal and inverting a potential of the electrical signal each time the optical signal is detected; and
a buffer circuit amplifying the electrical signal converted by the light inputting circuit and outputting the electrical signal,
wherein the light inputting circuit includes:
a first light receiving element and a second light receiving element each of which detects the optical signal from the optical transmission path;
a first switching circuit being connected to a second signal line which transmits the electrical signal to the buffer circuit, a first signal line to which the same potential as a potential of the second signal line is given, and the second light receiving element; and
a second switching circuit being connected to the second signal line, the first signal line, and the first light receiving element, wherein the first switching circuit makes the second signal line short-circuit to the power supply line from the ground in the case where the potential of the first signal line is equal to a potential of the power supply line from an operational power supply when the second light receiving element detects the optical signal, and the second switching circuit makes the second signal line short-circuit to the power supply line from the operational power supply in the case where the potential of the first signal line is equal to a potential of the power supply line from the ground when the first light receiving element detects the optical signal.

6. The light receiving circuit according to claim 5, wherein:
the first switching circuit has a pMOS transistor which has a gate electrode connected to the first signal line and a drain electrode connected to the second signal line;
the second switching circuit has an nMOS transistor which has a gate electrode connected to the first signal line and a drain electrode connected to the second signal line;
the first light receiving element has an anode connected to the power supply line from the operational power supply and a cathode connected to a source electrode of the pMOS transistor; and
the second light receiving element has an anode connected to a source electrode of the nMOS transistor and a cathode connected to the power supply line from the ground.

7. The light receiving circuit according to claim 5, wherein the buffer circuit has a first inverter circuit in which the electrical signal converted by the light inputting circuit is inputted, and a second inverter circuit in which a potential corresponding to the electrical signal inputted to the first inverter circuit is transmitted to the light inputting circuit.

8. The light receiving circuit according to claim 5, further comprising a reset circuit changing a potential at the output end of the light inputting circuit with respect to the buffer circuit to a preliminarily set potential.

9. A light receiving circuit comprising:
a light inputting circuit converting a one-system optical signal to be outputted from an optical transmission path to an electrical signal and inverting a potential of the electrical signal each time the optical signal is detected; and
a buffer circuit amplifying the electrical signal converted by the light inputting circuit and outputting the electrical signal,
wherein the light inputting circuit includes:
a first light receiving element and a second light receiving element each of which detects the optical signal from the optical transmission path;
a first switching circuit being connected to a first signal line to which the same potential as a potential of the second signal line which transmits the electrical signal to the buffer circuit is given, a power supply line from the ground, and the second light receiving element; and
a second switching circuit being connected to the first signal line, a power supply line from an operational power supply, and the first light receiving element,
wherein the first switching circuit makes the second signal line short-circuit to the power supply line from the ground in the case where the potential of the first signal line is equal to a potential of the power supply line from the operational power supply when the second light receiving element detects the optical signal, and the second switching circuit makes the second signal line short-circuit to the power supply line from the operational power supply in the case where the potential of the first signal line is equal to a potential of the power supply line from the ground when the first light receiving element detects the optical signal.

10. The light receiving circuit according to claim 9, wherein:
the first switching circuit has an nMOS transistor which has a gate electrode connected to the first signal line and a source electrode connected to the power line from the ground;
the second switching circuit has a pMOS transistor which has a gate electrode connected to the first signal line and a source electrode connected to the power line from the operational power supply;
the first light receiving element has an anode connected to a drain electrode of the pMOS transistor and a cathode connected to the second signal line; and
the second light receiving element has an anode connected to the second signal line and a cathode connected to a drain electrode of the nMOS transistor.

11. The light receiving circuit according to claim 9, wherein the buffer circuit has a first inverter circuit in which the electrical signal converted by the light inputting circuit is inputted, and a second inverter circuit in which a potential corresponding to the electrical signal inputted to the first inverter circuit is transmitted to the light inputting circuit.

12. The light receiving circuit according to claim 9, further comprising a reset circuit changing a potential at the output end of the light inputting circuit with respect to the buffer circuit to a preliminarily set potential.

13. A light receiving circuit comprising:
a light inputting circuit converting a one-system optical signal to be outputted from an optical transmission path to an electrical signal and inverting a potential of the electrical signal each time the optical signal is detected; and
a buffer circuit amplifying the electrical signal converted by the light inputting circuit and outputting the electrical signal,
wherein the light inputting circuit includes a light receiving element which detects the optical signal from the optical transmission path,
wherein the light receiving element comprising: an electrical conductor being disposed on an insulation layer; a first semiconductor being formed in the insulation layer; a second semiconductor being formed in the first semiconductor portion and being a pair in polarity with the first semiconductor; and a first electrode and a second electrode being disposed on the insulation layer and being a pair in polarity with each other, wherein:
the electrical conductor has an opening having an opening width smaller than the optical signal wavelength, and a periodic structure in which concave-convex are formed in symmetry with the opening as an axis and induces resonance between the optical signal and surface plasmon excited by said optical signal;
the first electrode is jointed to the electrical conductor;
the second electrode is jointed to the first semiconductor;
the second semiconductor is jointed to the electrical conductor, and is receiving near-field light generated by resonance between the optical signal and the surface plasmon via the opening.

14. The light receiving circuit according to claim 13, wherein the second electrode opposes to the first electrode on the insulation layer via the electrical conductor.

15. The light receiving circuit according to claim 14, wherein the second electrode is disposed at a cutout place which is formed in the periodic structure of the electrical conductor.

16. The light receiving circuit according to claim 15, wherein the periodic structure of the electrical conductor forms concentric concave-convex.

17. The light receiving circuit according to claim 14, wherein the periodic structure of the electrical conductor forms concentric concave-convex.

18. The light receiving circuit according to claim 13, wherein
the electrical conductor forms in a band shape including the opening; and
the second electrode forms a shape surrounding ends, which are not connected to the first electrode, of ends of the band shaped electrical conductor.

19. The light receiving circuit according to claim 18, wherein
the opening of the electrical conductor forms a slit shape being crossing the electrical conductor in a direction of a short side of the band shape, and
the periodic structure forms concave-convex in parallel to the opening.

20. The light receiving circuit according to claim 18, wherein the periodic structure of the electrical conductor forms concentric concave-convex.

21. The light receiving circuit according to claim 13, wherein the periodic structure of the electrical conductor forms concentric concave-convex.

22. A digital system comprising:
a plurality of light receiving circuits; and
an optical transmission path in which one-system optical signal is inputted to each of the plurality of the light receiving circuits,
wherein each of the plurality of light receiving circuits comprises
a light inputting circuit converting a one-system optical signal to be outputted from an optical transmission path to an electrical signal and inverting a potential of the electrical signal each time the optical signal is detected, and
a buffer circuit amplifying the electrical signal converted by the light inputting circuit and outputting the electrical signal,
wherein the light inputting circuit includes a light receiving element which detects the optical signal from the optical transmission path,
wherein the light receiving element comprising: an electrical conductor being disposed on an insulation layer; a first semiconductor being formed in the insulation layer; a second semiconductor being formed in the first semiconductor portion and being a pair in polarity with the first semiconductor; and a first electrode and a second electrode being disposed on the insulation layer and being a pair in polarity with each other, wherein:
the electrical conductor has an opening having an opening width smaller than the optical signal wavelength, and a periodic structure in which concave-convex are formed in symmetry with the opening as an axis and induces resonance between the optical signal and surface plasmon excited by said optical signal;
the first electrode is jointed to the electrical conductor;

the second electrode is jointed to the first semiconductor;

the second semiconductor is jointed to the electrical conductor, and is receiving near-field light generated by resonance between the optical signal and the surface plasmon via the opening.

* * * * *